United States Patent [19]

Lake et al.

[11] Patent Number: 5,519,253

[45] Date of Patent: *May 21, 1996

[54] COAXIAL SWITCH MODULE

[75] Inventors: Donald E. Lake, deceased, late of Rochester, by Juanita Lake, executrix; Charles T. Eytcheson, Kokomo, both of Ind.

[73] Assignee: Delco Electronics Corp., Kokomo, Ind.

[*] Notice: The term of this patent shall not extend beyond the expiration date of Pat. No. 5,444,295.

[21] Appl. No.: 116,793

[22] Filed: Sep. 7, 1993

[51] Int. Cl.$^6$ .......................... H01L 23/48; H01L 23/52; H01L 23/12

[52] U.S. Cl. .......................... 257/724; 257/692; 257/694; 257/733

[58] Field of Search .......................... 257/724, 690–695, 257/698, 733

[56] References Cited

U.S. PATENT DOCUMENTS 3,714,709  2/1973  Liederbach .......................... 0.29/626

FOREIGN PATENT DOCUMENTS

| 0035135 | 2/1981 | European Pat. Off. . |
|---|---|---|
| WO93/08601 | 4/1993 | European Pat. Off. . |
| 2441902A1 | 9/1974 | Germany . |
| 0150871 | 7/1987 | Japan .......................... 257/692 |

OTHER PUBLICATIONS

Patent Abstracts of Japan vol. 18, No. 88 (E-1507) JP-A-05 292 756 (Toshiba Corp.) 5 Nov. 1993 *abstract*.

Primary Examiner—Robert P. Limanek
Assistant Examiner—David Hardy
Attorney, Agent, or Firm—Mark A. Navarre

[57] ABSTRACT

A low inductance coaxial semiconductor switching module and methods of operating the same. The module can contain high power, high frequency semiconductor switching devices, operated to provide high power at low inductance. The module incorporates compositional, geometrical and electrical symmetry in a coaxial configuration. The module also includes short internal leads, a special circumferential array of substrates, a special circular gate circuit, a special circular kelvin circuit, and special terminal subassembly and special module mounting features.

39 Claims, 13 Drawing Sheets

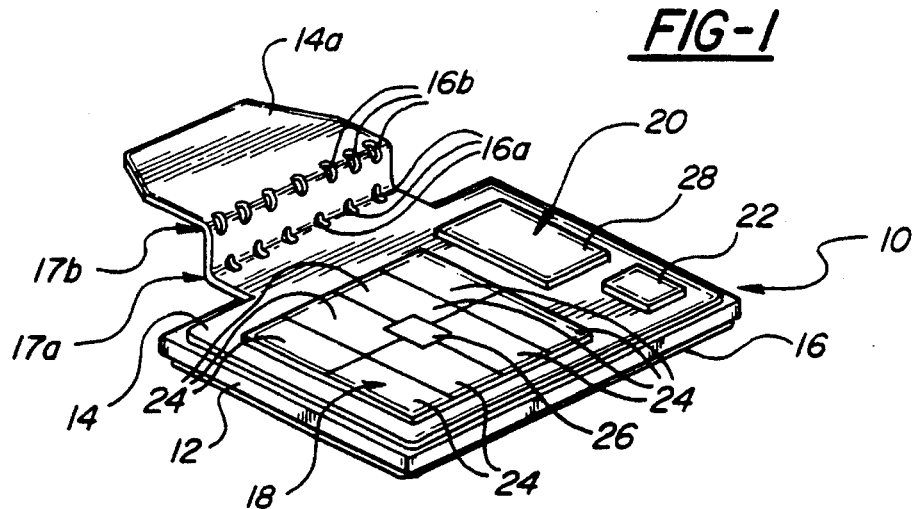
FIG-1
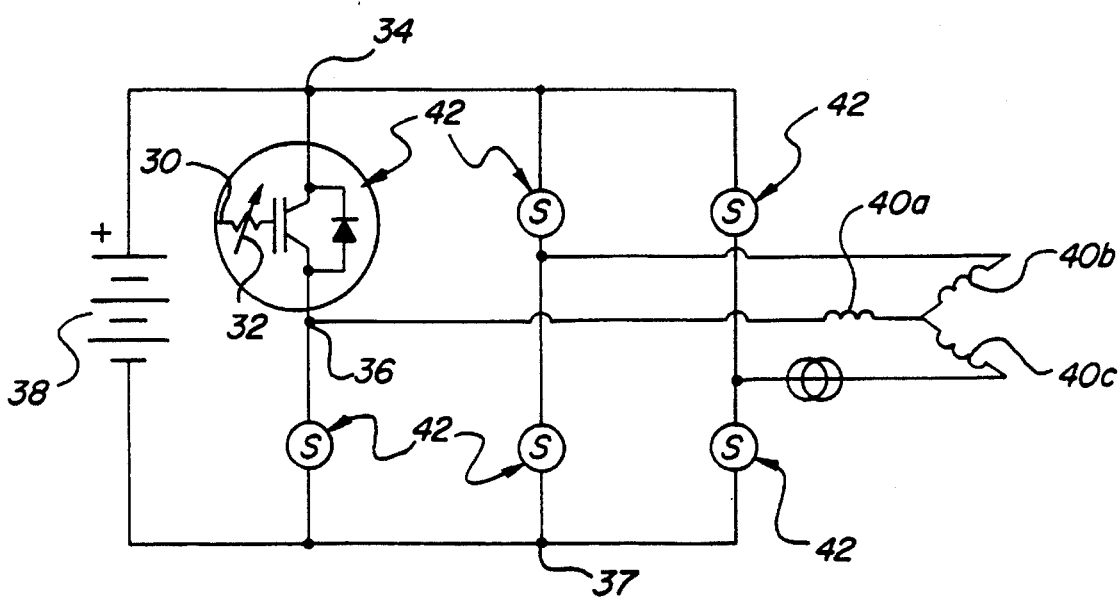
FIG-2
FIG-5

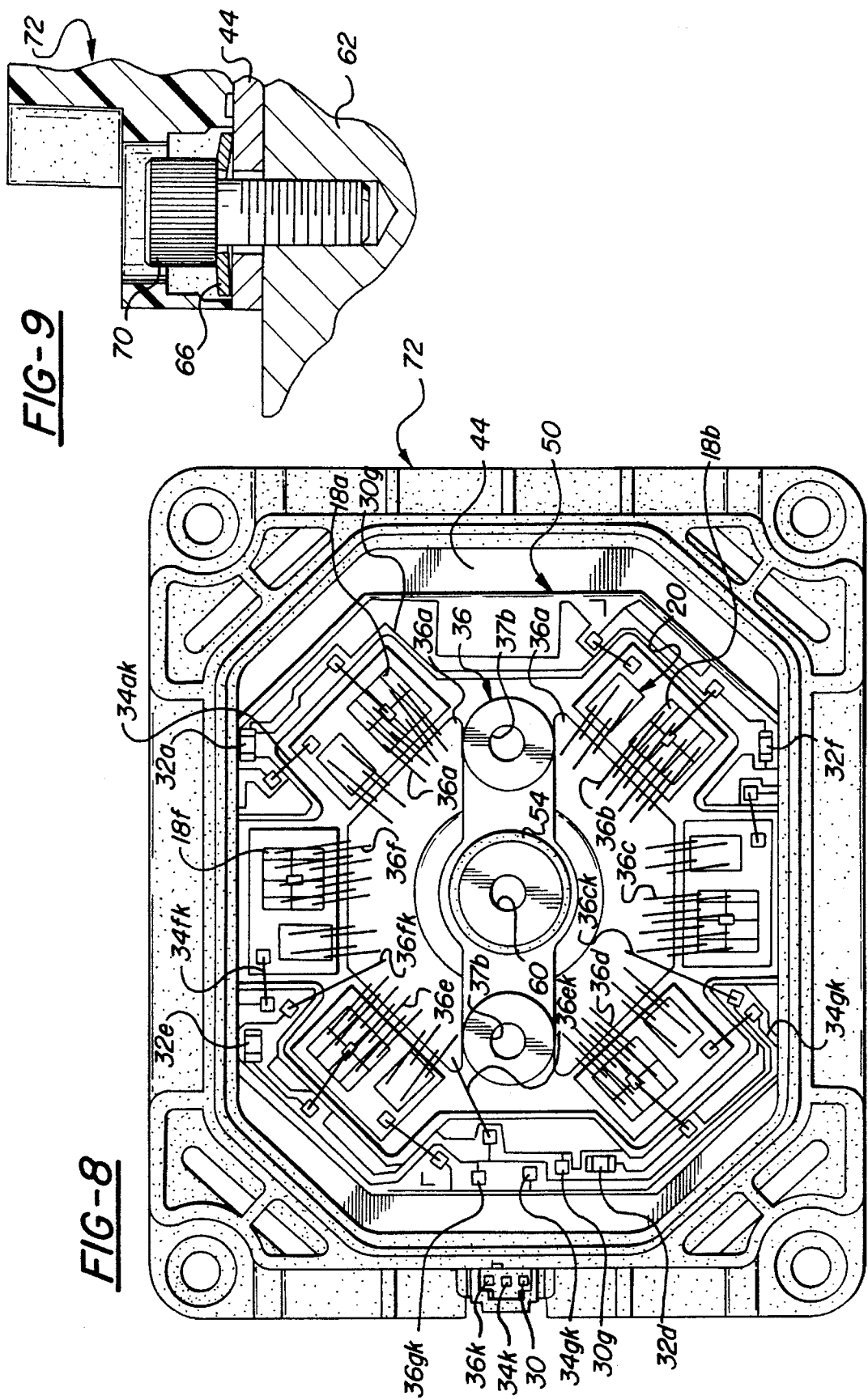

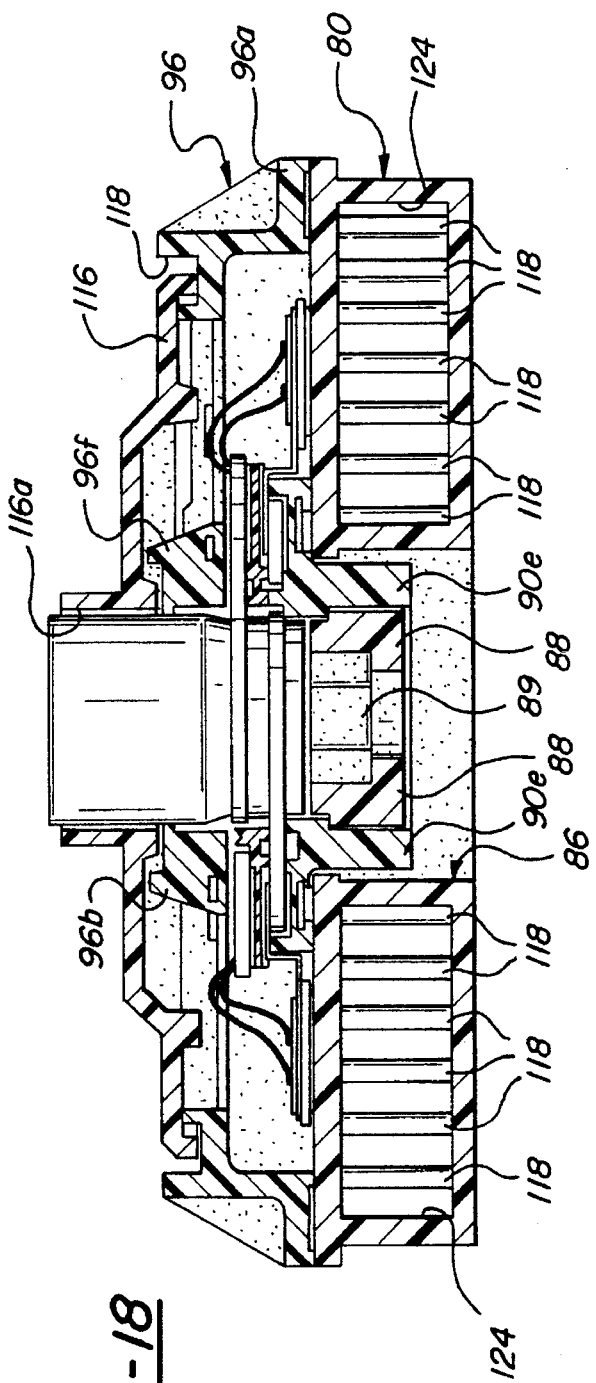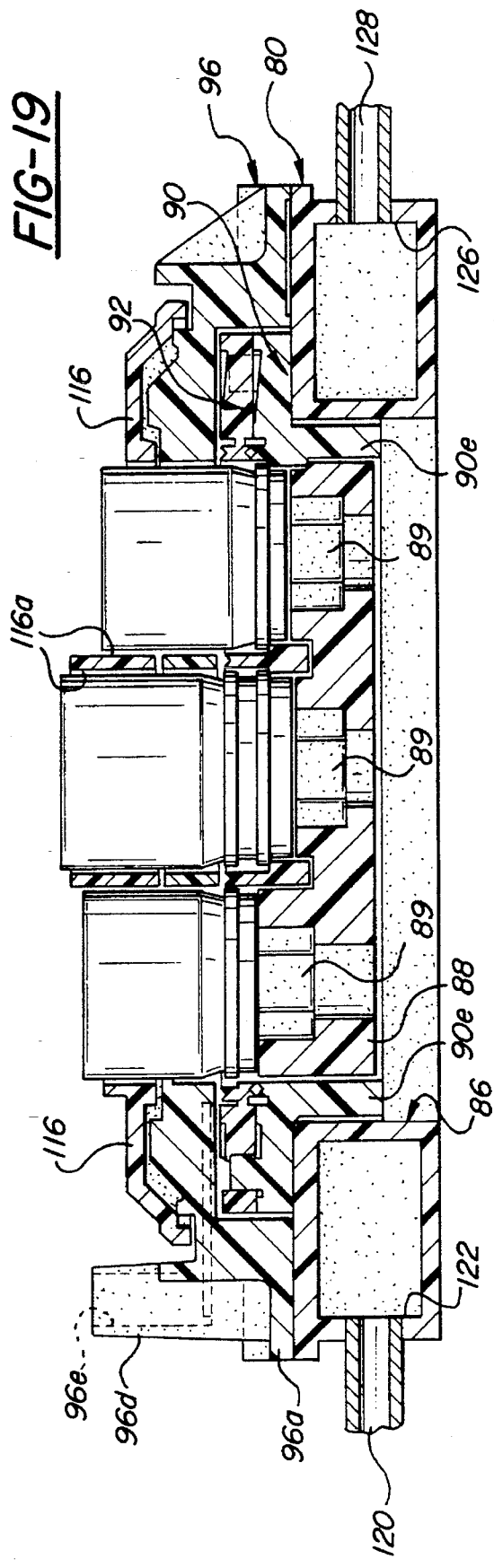

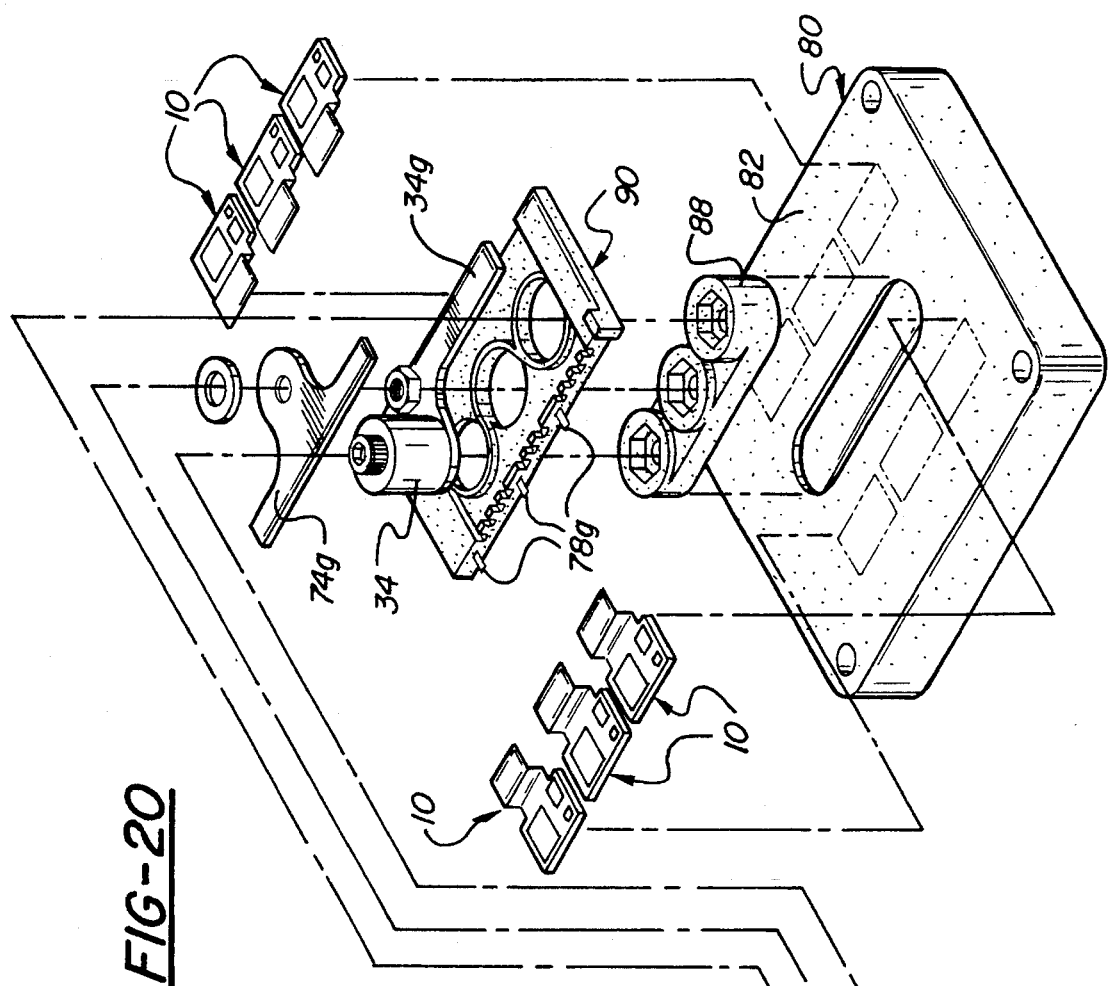
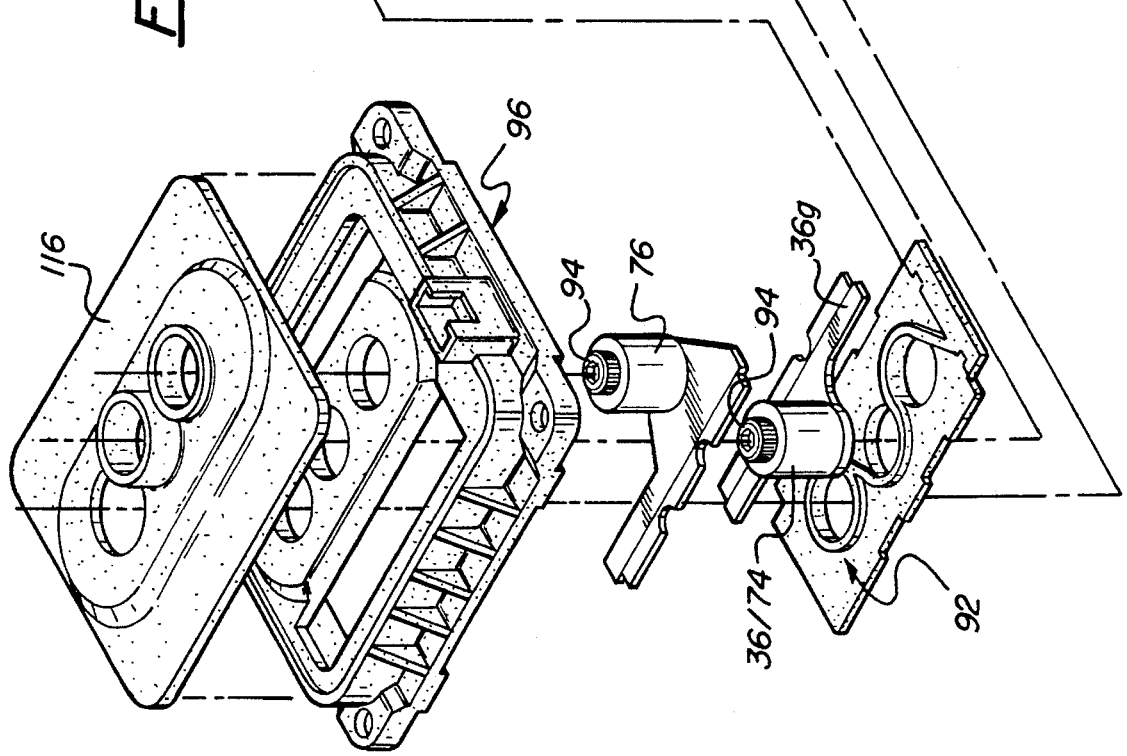
FIG-20

COAXIAL SWITCH MODULE

RELATED PATENT APPLICATIONS

This patent application is related to the following patent applications, some of which are concurrently filed and incorporated herein by reference, and all of which are assigned to the assignee of this patent application:

U.S. patent application Ser. No. 08/117,924, entitled "High Power Semiconductor Switch Module," and concurrently filed in the names of A. I. Alhoussami, C. T. Eytcheson and D. E. Lake;

U.S. patent application Ser. No. 08/118,112, entitled "Linear Dual Switch Module," and concurrently filed in the names of A. I. Alhoussami, C. T. Eytcheson and D. E. Lake;

U.S. patent application Ser. No. 08/208,244, entitled "Substrate Subassembly and Method of Making Transistor Switch Module," filed Mar. 9, 1994 in the names of C. T. Eytcheson, F. D. Lachenmaier, D. E. Lake, T. D. Martin, J. D. Tagle, and L. A. Viduya;

U.S. patent application Ser. No. 08/233,572, entitled "Electron and Laser Beam Welding Method and Apparatus," filed Apr. 26, 1994 in the names of C. T. Eytcheson, D. E. Lake; and P. E. Tonies; and U.S. patent application Ser. No. 08/278,199, entitled "Triaxial Double Switch Module," and filed Jul. 1, 1994 soon in the names of F. D. Lachenmaier, D. E. Lake, T. D. Martin, J. D. Tagle, and L. A. Viduya.

1. Field of the Invention

This invention relates to packaging of a high voltage/high current/high frequency semiconductor switching device. In a preferred embodiment, this invention relates to a power module containing a plurality of electrically paralleled high voltage and high current semiconductor switching devices that are operated at high frequency.

2. Background of the Invention

Insulated gate bipolar transistors (IGBTs) are an extremely attractive semiconductor device for power applications. They are more attractive than a power-type insulated gate field effect transistor (IGFET), which is popularly referred to as a MOSFET. An IGBT can handle both high voltages and high currents with small die size and with relatively low "on" resistance. In addition, an IGBT can be switched rapidly, making IGBTs potentially useful as switches in a three phase inverter for a high power alternating current motor application.

On the other hand, the high current density capability and low "on" resistance of the IGBT also present new challenges. The possibility of device failure is aggravated when the IGBT is handling high power. By high power, we mean current densities above about 135 amps per square centimeter of active chip area, at hundreds of volts. By high frequency switching we mean on/off frequencies above about 18 kilohertz, as for example 30 kilohertz. As might be expected, significant impedance, material and mechanical problems are encountered in handling such power at high frequencies and low resistances. This is especially true for a high power/high frequency module, in which several such IGBTs are electrically paralleled. Heretofore, the foregoing problems have been so difficult that not many high power/high frequency IGBT modules have been commercially manufactured. Those that were made thus far, have been made in relatively low volume, where each module could be individually specially crafted.

In this specification, we describe a high frequency/high power linear-type and circular-type modules that are capable of being manufactured on a commercial production basis. By commercial production basis, we mean production volumes such used in the automotive industry. Moreover, in describing this invention, we describe the principles by which still other modules can be designed for manufacture on a commercial production basis.

We describe high power/high switching frequency IGBT modules that have high efficiency and high durability, but are still economically manufacturable in automotive-type high volumes. Important generic features of both the linear-type and the circular-type modules are claimed herein, as well as their generic methods of manufacture.

OBJECT AND SUMMARY OF THE INVENTION

A principal object of this invention is to provide a module for handling high power electrical currents at high frequencies.

Another object of this invention is to provide a method of handling high power electrical current at high frequencies in a power module.

These and other objects of the invention are achieved in a module having one or more active switching devices that has a high degree of compositional, geometrical, and electrical symmetry. In addition, electrical leads are preferably kept extremely short, to reduce parasitic impedance effects.

In single switch embodiment of this invention, input and output terminals are substantially concentric and have overlapping integral circumferential flanges. The flanges are for electrical connection to a plurality of IGBTs that are symmetrically circumferentially arrayed around said flanges, in close radial proximity to said flanges.

In a dual switch embodiment, input and output terminals are two pairs of overlapping flat plate-like conductors. Each plate in each pair of overlapped plates has a linear edge registered with the other plate edge of the pair. The registered edges of one terminal pair is laterally disposed from, and generally parallel to, the registered edges of the other pair. A separate parallel row of generally equally spaced IGBTs is disposed close to each pair of registered edges. A parallel row of input/output terminals is disposed equally between the edges of the plate pairs. A portion of each plate extends under only one terminal, and is connected to that terminal.

BRIEF DESCRIPTION OF THE DRAWING

FIG. 1 shows a perspective view of a switching transistor substrate subassembly used in a module of this invention.

FIG. 2 shows an electrical schematic of the switching transistor substrate subassembly shown in FIG. 1.

FIG. 5 shows an electrical schematic of a three phase DC to AC inverter which uses six switching transistors or six of the single switch modules shown in FIGS. 6–11.

FIG. 8 shows a plan interior view of the module of FIG. 7 in a later stage of assembly that includes the outer coaxial terminal, the housing side walls, and filamentary wire connectors.

FIG. 9 shows a cross-sectional view along the line 9—9 of FIG. 6.

FIG. 18 shows a central sectional view through the width of the module of FIG. 17 after a housing cover was added.

FIG. 19 shows a central sectional view through the length of the module of FIG. 17 after a housing cover was added.

FIG. 20 shows an exploded isometric view of the linear type dual switch module shown in FIGS. 12–20.

DESCRIPTION OF THE PREFERRED EMBODIMENTS OVERVIEW DESCRIPTION

Figure 3:
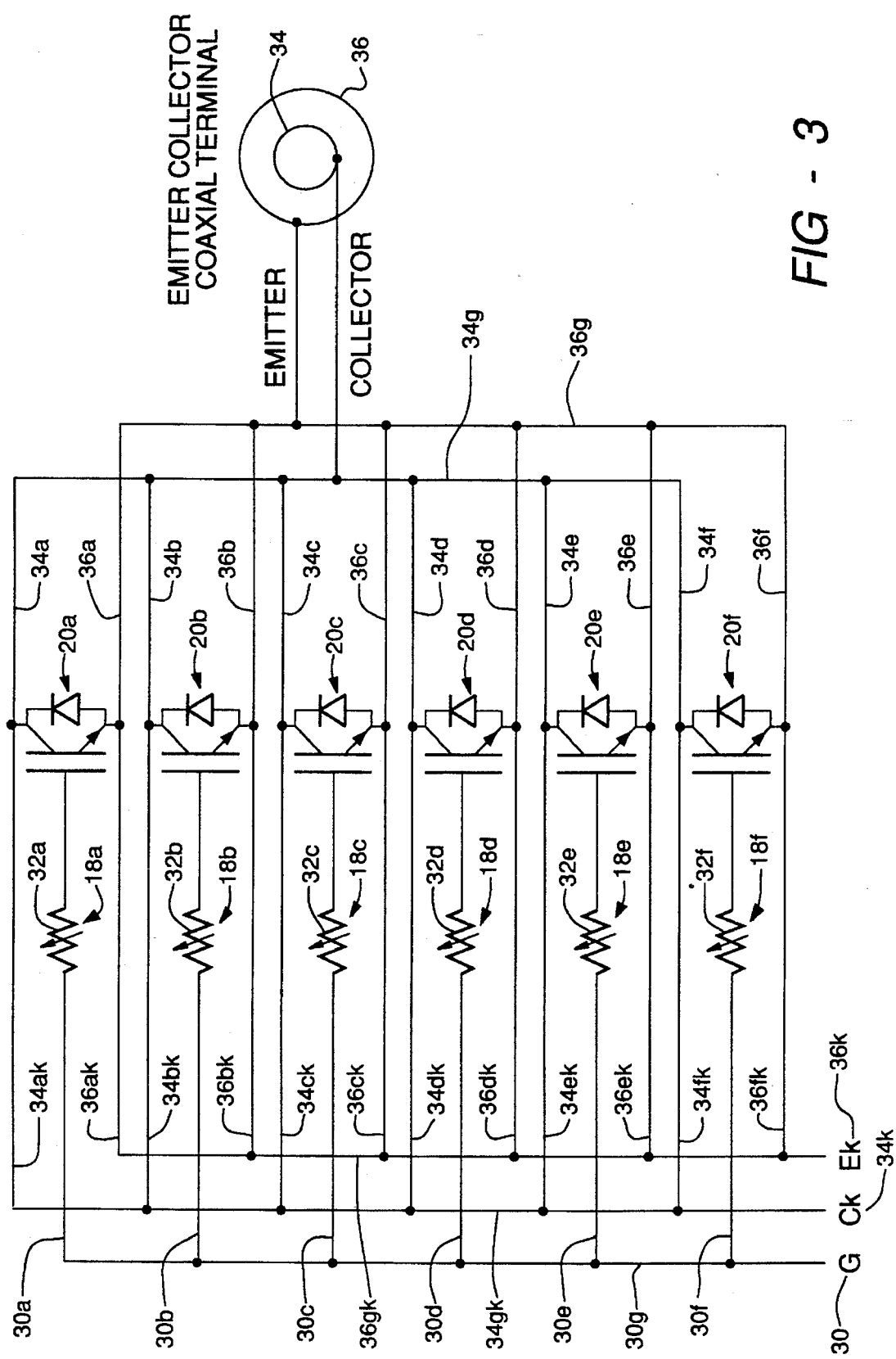
FIG. 3 shows a conceptual electrical schematic of a single switch module containing several electrically paralleled substrate subassemblies of the type shown in FIGS. 1 and 2.

In this invention important chemical, mechanical and electrical considerations have been combined in a very special way to obtain a high power/high frequency switch of low inductance. This special interdependency is not believed to be readily apparent, or understood, merely from a simple description of the switch assembly. The function and interdependency of switch parts has to be described as well.

Two complex switch modules are to be described. To avoid repetition, and to make their features and operation more readily understandable, important generic aspects of them shall be described first.

As indicated above, this invention involves a semiconductor module for handling high power electrical currents at high frequencies. It also involves the making and the operation of such a device. The module has one or more active switching devices and exhibits a high degree of compositional, geometrical, and electrical symmetry. In addition, electrical leads between any power device in the module and input and output terminals for the module are preferably kept extremely short, to reduce parasitic impedance effects in the module.

Input and output conductors for any given semiconductor device in a module are preferably designed to have a similar impedance. Also, if the module has multiple devices that are electrically in parallel, all input leads are preferably of the same material and of the same configuration. This insures equal, i.e., uniform, impedance among all input leads and all output leads, respectively, and a similarity in impedance between input and output leads. Such uniformity and similarity in input and output leads are a part of the module compositional and geometrical symmetry contemplated in this invention. Input and output conductors usually will each have multiple parts. For example, there may be a special external portion adapted for special connection to an external bus, an intermediate portion adapted for connection to a semiconductor switching device, and a portion that actually makes the connection. The latter part would be one or more filamentary wires or contact bumps that interconnect one or more selected regions of a semiconductor chip with the intermediate portion of a particular conductor. Hence, we construe the bonded filamentary wire or contact bump to be an inner end part of the conductor in the completed module. Compositional and geometrical symmetry is desired among all corresponding parts of all input conductors, among all corresponding parts of all output conductors, and to the extent similarity is practical, between input and output conductors.

The benefit of compositional and geometrical symmetry in input and output conductors is uniformity in current flow to and from all paralleled devices in the module. This uniformity in input/output current flow inherently comprises an initial important part of electrical symmetry contemplated in this invention.

A further extension of the foregoing geometrical symmetry provides a second part of the electrical symmetry that is important to this invention. The shape and size of the input and output conductors, at least in their intermediate portions, allows at least these portions to be disposed close to one another. The type of close disposition we have in mind is one in which the parts fit together or nest together, with a dielectric layer spacing them apart. Further, when the completed module is operated, such disposed, fitted or nested portions of the input and output conductors have an electrical current flow that is substantially parallel but opposite in direction. Outer portions can be so disposed also, as for example in concentric terminals. In concentric terminals one might say that the respective configurations are the same or similar. Others might say that they are only complementary. In any event, their configurations are such as to provide another aspect of geometrical symmetry, which can be referred to as close parallel proximity.

In the concentric terminal embodiment of this invention shown in the drawing, a single element forms the outer and intermediate portions of the input and output connections to all the devices in the module. A separate concentric element is used for each of the input and output, of course. Such a construction is advantageous in its simplicity and manufacturing cost. Nesting of the concentric terminal portions is simple but effective. Also, it is statistically quite durable because of its simplicity. Care must be taken to insure that all chip-to-element electrical connections are symmetrical in placement and type, to preserve impedance uniformity between the point of external connection to the terminal and the chip surface. This will probably require circumferential symmetrical disposition of module chips around the concentric input and output conductor elements.

These extensions of geometric symmetry provide a second aspect of electrical symmetry as well. When the input and output conductor portions are placed in close parallel proximity, current flow in those portions is parallel but opposite in direction. The close proximity of the opposed current flows, allows the inductance of one current flow to at least partially negate, and even substantially cancel, inductance of the other current flow. Substantial reductions in inductance have been achieved using this effect. This inductance cancellation provides a second important part of electrical symmetry contemplated by this invention.

It is recognized that providing substantial close parallel proximity in input and output connections to a given semiconductor chip is difficult. This is because at least one of the connections must be a multiplicity of filamentary wires, each of which forms an arch between its ends. The other connection most likely will be linear or rectilinear, as in a straight or bent tab or strip soldered to the backside of the chip. One should at least make the input and output connections to the chip parallel in one plane, as for example having an input bonding wire oriented to extend in the same direction as an output tab or strip. In any event, the portions of the chip-to-conductor connections that cannot be made completely parallel should be made as short as is practical. This would favor use of contact bumps for the chip-to-conductor connection if a practical way of using them in such an assembly can be found.

Reference is now made to a third important aspect of electrical symmetry that must be observed in a module of our invention. It involves device matching. All of the transistors and diodes used in our module will have been tested and sorted. Only matched transistors and diodes our used in our module. Not only that, only matched transistor/diode pairs on the substrate subassemblies are used. By this we mean that after the transistors are paired with a diode and mounted on a substrate subassembly, such as substrate subassembly 10 in FIG. 7, they are tested again. The substrates having similar operating characteristics are put in the same module. One particular operating characteristic that may be most important is maximum current level of the transistor as mounted on the substrate. Thus, the individual transistors/diode pairs in the module, that are electrically connected in parallel, should have similar individual operating characteristics. Moreover, the closer one wishes to operate all of such paralleled devices at their maximum power ratings, the closer they should be matched in their maximum current level rating.

Matching operating characteristics is important. If the impedance of one device is significantly less than that of other paralleled devices, that one device tends to hog more and more current, until device failure. Such action can occur very rapidly.

Analogously, if the transistors are not matched in their maximum current level ratings, one transistor at a lesser rating can cause all the other transistors to be operated at less than their maximum current rating.

There is a supplemental facet to the third aspect of electrical symmetry. The supplemental facet is that the matched devices should have matched cooling. Matched cooling is important because a semiconductor device generates heat during operation. If the heat is not removed, the device will increase in temperature. If it increases in temperature, its operating impedance is reduced. This effect in turn generates still more heat, which can cause an avalanche effect to catastrophic device failure. By matched cooling, we mean that chip operating temperatures remain matched, i.e., substantially equal, during even extended operation at maximum rated power. Hopefully, they even remain constant in temperature. Matched cooling can be achieved by equal cooling of the device chips. It can also be achieved by cooling each chip at a different rate, but at a rate which is considerably greater than the rate at which heat is generated by the chip, and which maintains the chip below a predetermined operating temperature. Matched cooling might be obtainable by symmetrically disposing the device chips on a substrate, and cooling the entire substrate uniformly, or at least in the substrate portion where the chips are disposed. Alternatively, one might choose to selectively, but uniformly, cool each substrate area where a chip is disposed.

A fourth aspect of electrical symmetry is used in this invention as well. The fourth aspect of electrical symmetry resides in providing a predetermined, usually matched, control signal to each of the paralleled semiconductor devices in the module. To achieve this goal in an insulated gate controlled semiconductor switching device, the gate control circuitry should provide an identical control voltage to each device. We recognize this is possible to do by design. However, for commercial manufacturing convenience, we prefer to include at least one trimmable resistance in the gate circuit. In our preferred embodiments, we like to include a separate trimmable resistance in the gate circuitry for each paralleled device in the module. Each trimmable gate resistance can be trimmed after the gate circuit is assembled. In such instance the gate circuit can be made with considerably greater performance tolerance, and at lesser cost. The trimmable gate resistance is trimmed to provide equal voltage and/or current to each paralleled semiconductor device in the module. Such balance, or matching, of gate control signal is still another factor needed to preserve electrical symmetry in device operation. One may even want to include such a trimmable resistance in a package or module containing a single device, to tailor the output of such a package or module to be like that of another package or module.

The semiconductor switching devices contemplated for the high frequency modules of this invention are preferable and most importantly insulated gate bipolar transistors (IGBTs). IGBTs are capable of significantly higher current densities and switching speeds than insulated gate field effect transistors (IGFETs), which are popularly also referred to as MOSFETs. IGBTs have been the devices of first choice for high power applications. However, they have previously not been used extensively, especially for large volume applications, because of difficulties in suitably packaging them. One considerably difficult packaging problem was high package inductance. This invention solves that problem, and others as well. For example, this invention makes it easier to use multiple IGBTs paralleled in a module as one switch. Hence, especially high current modules can be more readily commercially produced using this invention. A principle application of this invention is for switch modules to be used in a three phase inverter for an electric automobile.

On the other hand, MOSFET, or IGFET, modules can benefit from this invention too. Nonetheless, for simplicity, the following discussion will focus on IGBT modules, because they can benefit the most from this invention.

Figure 4:
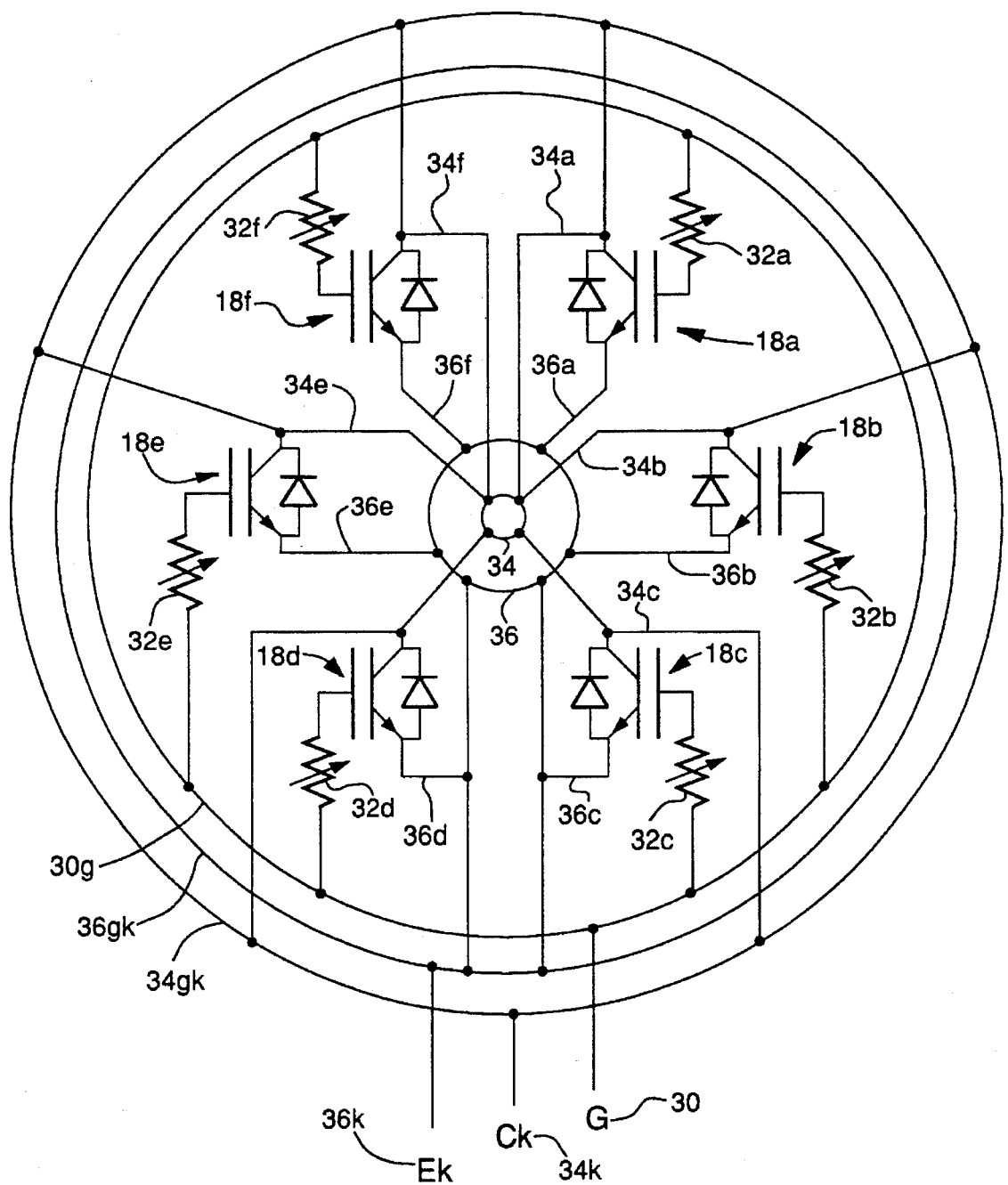
FIG. 4 shows the electrical schematic of FIG. 3, as it is actually embodied in FIGS. 6–11.

As to the modules contemplated in this invention, even a module containing only one semiconductor switching transistor chip can benefit from this invention. However, as indicated above, this invention is particularly beneficial for a module containing several switching transistor chips that are electrically in parallel. Such paralleled chips can form single or multiple switches. A single switch is schematically shown in FIGS. 3 and 4, and actually shown in concentric form in FIGS. 6 through 11. However, this invention is even more beneficial to multiple switch modules. A high side/low side double switch is schematically shown in connection with FIGS. 12–13. A linear version of the such a high side/low side double switch is actually shown in FIGS. 14–20.

A concentric version of a high side/low side double switch is the subject of copending U.S. Ser. No. 08/278,199 set forth in the above-referenced U.S. patent application Ser. No. 08/116,793. It describes a complexly segmented triaxial concentric terminal that has coplanar terminal contact areas for all devices of both switches. It also describes a unique pretestable substrate subassembly for each switching transistor chip. Each unique substrate subassembly has generally parallel input and output conductor tabs. The tabs have generally coplanar end portions for connection to the generally coplanar contact areas of the complex triaxial terminal. The input and output tabs are respectively in low resistance electrical communication with input and output areas of a switching transistor chip mounted on the substrate subassembly. A unique five-layer substrate, of alternating copper and dielectric layers, permits formation of the coplanar input and output tabs on the resultant substrate subassembly. The individual substrate subassemblies are circumferentially arrayed around the triaxial terminal, analogous to the concentric single switch embodiment described more fully herein.

DETAILED DESCRIPTION

Reference is now specifically made to FIG. 1. FIG. 1 shows a substrate subassembly 10 that comprises a 21 millimeters by 14.5 millimeters beryllium oxide plate or wafer 12 of about 1 millimeter in thickness. Beryllium oxide is a particularly effective dielectric material for use in this application. It has a high thermal transfer coefficient but has a thermal expansion coefficient similar to that of silicon. Aluminum oxide and aluminum nitride also generally match silicon in thermal expansion characteristics. However, beryllium oxide has a thermal transfer coefficient considerably higher. In such instance, wafer 12 can be made correspondingly thicker, which, in turn, reduces parasitic capacitance between the upper surface and lower surfaces of wafer 12 which are metallized, as hereinafter described. We also hereinafter describe the metallized wafer as soldered to the surface of an electrically conductive bottom plate of a housing. Regardless of the size of the housing, or the number of switching transistors disposed in the housing, wafer 12 is only big enough to support one switching transistor and necessary associated circuitry, such as for thermal tracking or other symmetry purposes. This reduces the area of the metallized surfaces, and further reduces parasitic capacitance.

Upper copper foil plate 14 and a lower copper foil plate 16 are disposed on opposite faces of wafer 12. Copper foil plates 14 and 16 are each about 20 millimeters by 13.5 millimeters and are about 0.25 millimeter thick. They are secured to the opposite major surfaces of beryllium oxide wafer 12 by any acceptable technique, as for example, direct copper bonding. Direct copper bonding is a known and accepted practice in which copper oxide is used to bond a copper sheet to a ceramic substrate. Upper copper plate 14 has an integral generally rectangular extension 14a that is about 14 millimeters wide and about 13.3 millimeters long. Accordingly it overhangs wafer 12 about 12.8 millimeters. The exposed portions of the copper foil on top of the wafer, i.e., excluding tab 14a, has a 6.35–10.2 micron silver coating thereon to enhance solderability.

Extension 14a has a row of holes 16a and a second row of holes 16b, that are mutually substantially parallel and also substantially parallel the adjacent edge of the wafer 12. The holes 16a and 16b are about 0.9 millimeter in diameter and spaced apart on about 2 millimeter centers in each row. The center line of the row of 16a holes is parallel to the edge of the wafer and is spaced about 2.24 millimeter from the edge of the wafer. The centerline of the row of 16a holes is parallel to the centerline of the row of holes 16b. The centerlines of both rows of holes 16a and 16b are spaced about 2.36 millimeter apart. The row of holes 16a forms a first line 17a of stress relief in tab 14a. Line 17a is, thus, a first easy-bend line in tab 14a. The row of holes 16b forms a second line 17b of stress relief in tab 14a. Line 17b is, thus, a second easy-bend line in tab 14a. As can be seen in FIG. 1, tab 14a has two opposite right angle bends along bend lines 17a and 17b that form a step in tab 14a. This step facilitates connection of the substrate subassembly to the center terminal member, as will be later apparent.

A silicon semiconductor switching transistor 18, such as an insulated gate bipolar transistor (IGBT) or an insulated gate field effect transistor (MOSFET), is disposed on the exposed major surface of upper copper plate 14. A soft, fast silicon semiconductor diode (SFD) 20 is also disposed on the exposed major surface of upper copper plate 14, next to switching transistor 18. Such a device is not considered to be an insulated gate device, or a high powered semiconductor switching transistor. A small plate 22 is also disposed on copper plate 14. Small plate 22 is present to facilitate bonding of an aluminum filamentary wire to copper plate 14. If the filamentary wire that is bonded is of aluminum, it is preferred that the small metal plate 22 have an aluminum outer surface. Small metal plate can be of an aluminum/copper laminate with the copper side soldered face down on the outer surface of copper plate 14. On the other hand, it is recognized that small metal plate 22 could be of any material that is metallurgically compatible with the filamentary connecting wire used. Analogously, the lower surface of small metal plate 22 can be of any material compatible with the process used to bond plate 22 to upper copper plate 14. The filamentary bonding wires are shown in FIGS. 8 and 9 of the drawing.

FIG. 2 is an electrical schematic of the subassembly illustrated in FIG. 1. The diode chip 20 forms a blocking diode across the emitter collector terminals of the switching transistor. It is used to protect the switching transistor 18 by shunting current from temporarily reversed voltages that may occur in the system in which this switch is used. As can be seen from FIGS. 1 and 2, each switching transistor 18 is paired with a shunting diode. The transistor chip 18 and diode chip 20 are preferably made of substantially similar semiconductor material, and by substantially similar processes so that they can have substantially similar performance characteristics, including change in initial characteristics with change in temperature. Still further, each shunting diode 20 is disposed in close thermal proximity to its switching transistor 18 so that the pair would experience a similar temperature environment. This aids in providing more consistency in operation of the resulting switch.

As indicated above, a plurality of pairs of such switching transistors 18 and shunting diodes 20 would normally be used in parallel for high power switches. In FIG. 3 six such pairs are electrically paralleled to form a single switch module. Each gate lead for each switching transistor 18a–18f has a trimmable resistance 32a–32f in series with it.

The trimmable resistance is also shown as reference numeral 32 in FIG. 5. Its importance will hereinafter be explained.

The electrical schematic in FIG. 3 conceptually shows how the six switching transistors, and their associated diodes, are electrically paralleled. Also, in order to make such a paralleled circuit, only switching transistors having quite similar electrical performance characteristics should be used. In such instance, no one switching transistor will tend to "hog" current, and cause an avalanche failure of the transistor and then the module. Analogously, care must be taken that all the paralleled transistors are mounted the same, so that they are more likely to be at the same operating temperature.

Others might think that the foregoing indicates all the transistors in a multiple switching transistor module should be mounted on a common ceramic substrate. However, we have recognized that if all the transistors are mounted on a common substrate, the substrate becomes unduly large in area and complexity. Masking of the substrate for selective metallization may be required. The large area tends to increase parasitic capacitance between the top metallized surface of the ceramic substrate and a conductive backplate on which it will be disposed. The large area may also preclude use of beryllium oxide, even though its higher thermal transfer rating might allow a higher current rating and/or produce a lower parasitic capacitance in the resulting module. Increased complexity, that would be inherent to the large substrate, reduces yields of the large substrate, and thereby increases its cost.

One of the important inventions disclosed in this application is that each switching transistor is disposed on its own ceramic substrate. As indicated above, this is used to minimize individual and total size of the substrate. However, this provides still another benefit. If the substrates are relatively small, substantially the entire substrate surfaces can be metallized, without appreciably increasing parasitic capacitance. This eliminates masking for metallization. Elimination of masking, further reduces cost. Yields of transistor groups will increase, because imperfect one transistor/substrate combinations or subassemblies can be discarded before the groups are formed. In addition, the mounting of a smaller substrate onto the housing bottom plate is easier, and more readily fixable if the initial mount is not satisfactory. Accordingly, yields can increase still further. Increased yields, of course, mean lower cost products, and indirectly superior products.

A corollary to the foregoing is that such cost reductions tend to make use of beryllium oxide even more practical for larger volume use. Hence the attendant increase in module performance becomes more practical for commercial production applications, and improved products more available to the public.

In addition, use of individual substrates for each switching transistor provides still another benefit, partly referred to above. Each substrate can be individually tested, graded, and sorted after being made. Unsatisfactory chip/substrate combinations can be discarded before any more value is added to them. This affects cost. Grading transistors before grouping is very important. However, unmounted transistor chips cannot be tested as thoroughly as mounted transistor chips. Accordingly, our mounted chips, i.e., substrate assemblies 10, can be graded better. If they can be graded better, they can be matched better. From a module performance standpoint, this is very important. With better initial matching, the poorest performer in any group is still close to the best. Accordingly, even if the group must be operated at the power level of the poorest performer to prevent current "hogging", the group can now be operated closer to the power level of the best. It follows then that increased performance groups can now be realized, and/or that the average power level utilization of all transistors used in groups is increased. More specific information about substrate subassembly 10, and its method of formation, tab 14a, and progressive assembly techniques involving substrate 10 are described and claimed in the related U.S. patent application Ser. No. 08/208,244.

Further, we recognize that there are differences in length, and an attendant variance in voltage drop, in the gate lead 30g to the respective switching transistors 18a–18f in a module. In this invention, even slight differences in such voltage drop can be avoided. We propose including a trimmable resistor 32a–32f in the gate lead between 30g and each of switching transistor 18a–18f, respectively. Each of the trimmable gate lead resistors allows the gate voltage supplied to each transistor to be the same. Thus, the "on" resistance characteristics of each switching transistor in the group comprising the resulting module is more likely to be similar. This helps make actual performance of the switching transistors match even more, after mount. The trimmable resistor may even be used to adjust operating level of the mounted and assembled group to the level of one switching transistor that results in a lesser performance characteristic than pretesting indicates it should exhibit. Thus, the potential for current "hogging" in the group is reduced even further. Such a resistance can even be used to match the switches paired in an inverter, especially if only one or two transistors are used for each switch. This is one of the reasons that resistance 32 is shown in the enlarged switch 42 in FIG. 5.

Referring back to FIG. 1, the surface of switching transistor 18 is divided into a multiplicity of aluminum electrode or contact areas, i.e., wire bond areas, to reduce emitter series resistance. In this example, there are eight such areas. They surround a smaller rectangular aluminum alloy gate electrode or contact area 26. In this example, chip 18 is an IGBT. The back side of the chip 18 forms a collector region for the switching transistor 18, which region is in low resistance electrical communication with copper plate 14, as by soldering or the like. The larger rectangular regions 24 on the upper surface of chip 18 form generally uniformly spaced emitter contacts on the IGBT surface. As indicated above, emitter contacts 24 surround the central gate electrode contact region 26. A single filamentary wire is adequate for gate lead contact because the gate lead does not carry much current.

The emitter region of the diode chip 20 is its entire upper surface, which is metallized to have an electrode thereon 28 of aluminum alloy suitable for wire bonding. The lower surface of diode chip 20 is soldered to the upper surface of copper plate 14. Accordingly, the cathode of chip 20 and the collector of the switching transistor 18 are electrically paralleled, as shown in FIG. 2.

It can be seen in FIG. 3 that the normal conceptual way of presenting such a circuit is to dispose the emitter lead of one device next to the collector lead of another. In this invention, that is not done. It should also be noticed that when one views such a circuit conceptually the transistors are aligned in a row for convenience of illustration, even if one wanted to eventually connect them to a coaxial bus. This suggests actually mounting them that way for simplicity. However, mounting and connecting them as conceptually shown, leads to a poorer module. FIG. 3 is only included in this description to make it easier to understand the more complex layout of devices and resistances that are in fact used in this invention.

FIG. 4 shows the same circuit shown in FIG. 3. However, it is an electrical schematic of the actual layout of devices, resistances and conductors in the coaxial terminal module shown in FIGS. 6–11. As can be seen, the actual circuit is far more complex than the conceptual one. Since the circuit of FIG. 4 corresponds to the circuit of FIG. 3, the reference numerals are also shown as corresponding.

FIG. 3 shows IGBT switching transistors 18a–18f, which are respectively paired with soft fast shunting diodes 20a–20f. The switching transistors 18a–18f respectively have gate leads 30a–30f. Gate leads 30a–30f respectively have trimmable electrical resistances 32a–32f. As indicated above, the trimmable electrical resistances 32a–32f are included in each respective gate lead between gate conductor 30g and each of switching transistors 18a–18f. For an IGBT power transistor having a die size of about 9.8 millimeters×9.8 millimeters, a trimmable resistor having a nominal printed resistance of about 4 ohms (trimmable to about 7.5 ohms) can be used. Gate leads 30a–30f, including their respective series resistors 32a–32f, are electrically connected in parallel to gate conductor or lead 32g. Gate conductor 32g leads to a gate terminal, indicated by G and reference numeral 30.

Transistors 18a–18f respectively have collector leads 34a–34f. Transistors 18a–18f respectively have emitter leads 36a–36f. Collector leads 34a–34f are each connected to a common lead 34g, which electrically parallels all of the collector leads 34a–34f. Analogously, emitter leads 36a–36f are each connected to a common lead 36g, which electrically parallels all of emitter leads 36a–36f. Collector lead 34g is a low resistance communication with center terminal 34. Emitter lead 36g is in the low resistance electrical communication with the coaxial emitter terminal 36.

Two additional leads are shown to each of the transistors 18a–18f. These are leads used to determine potential of the collector and emitter leads, to continuously monitor their operating characteristics during operation of the module. We prefer to chiefly monitor deviations from predetermined values. We refer to these connections as "Kelvin" connections. Collector Kelvin leads 34ak–34fk are respectively connected to the collectors of transistors 18a–18f. Analogously, emitter Kelvin leads 36ak–36fk are connected to the emitter leads of transistors 18a–18f. Lead 34gk ties collector Kelvin leads 34ak–34fk together, in an electrically parallel arrangement, and places each of them in low resistance contact with the collector Kelvin terminal 36k. Analogously emitter Kelvin lead 36gk electrically parallels all emitter Kelvin leads 36ak–35fk and places them in low resistance electrical communication with emitter Kelvin terminal 34k.

In FIG. 4 the concentric terminals 34 and 36 respectively comprise output and input terminal posts for the module. The six transistor/diode pairs shown in FIG. 3 are circumferentially symmetrically arrayed around the center terminals. The array is as uniform as the structure appears to permit. It results in collector leads 34a–34f being of substantially the same length. Corresponding portions of emitter leads 36a–36f are also of substantially the same length. Gate leads 30a–30f, including their trimmable resistors 32a–32f, are all of about of the same length. One can consider that transistors 18a–18f, collector leads 34a–34f and emitter leads 36a–36f are radially arrayed about the coaxial center terminals. Gate leads 30a–30f can be considered as radially arrayed too.

Concentric gate lead 30g, concentric emitter Kelvin 36gk and concentric collector Kelvin lead 34gk surround the circle of transistor/diode pairs. These leads respectively are connected to module gate terminal 30, collector Kelvin terminal 34k and module emitter Kelvin terminal 36k. Gate leads 30a–30f are symmetrical and are each connected to concentric gate lead 30g. Collector Kelvin leads 34ak–34fk are each connected to concentric collector Kelvin lead 34gk. The emitter leads only have two Kelvin leads, 36ck and 36dk. They are connected to concentric emitter Kelvin lead 36gk at the bottom of FIG. 4.

FIG. 5 shows an electrical schematic of a three-phase inverter circuit that converts direct current (DC) from a battery 38 to alternating current (AC) for use by an alternating current motor 40. As it can be seen, each of the three motor windings 40a, 40b and 40c is connected between a pair of switching transistors, or a pair of two groups of electrically paralleled switching transistors. Each transistor, or group of such transistors, forming a single switch is indicated by reference numeral 42. Each such switch 42 can thus be the module represented in FIGS. 3 and 4, or more importantly a module made in accordance with this invention. For clarity of illustration only one transistor/diode pair and its associated terminal resistance is shown in FIG. 5 in the enlarged area. As indicated above, when IGBTs are used for such switches, they cannot be satisfactorily used by just turning them on and off once for each cycle they are to cover. These devices turn "on" hard, which produces a square wave, not a sine wave. To get appropriately configured sine wave output, IGBTs are turned "on" and "off" very rapidly, many times during each sine wave cycle, using increasing and then decreasing gate voltage and pulse width modulation. Turn on/turn off frequencies of 20,000–30,000 Hz are not unusual for automotive traction motor applications. As previously indicated, the parasitic capacitance associated with such rapid switching is so significant that it has heretofore prevented high power IGBTs from being extensively used. This invention reduces such parasitic capacitance to a low level and reliability and performance to a high level. The improvement is so great that the inventions disclosed herein are incorporated in modules for an automotive electric vehicle AC traction motor application of a major manufacturer.

Reference is now made to FIGS. 6–11, which show the actual module illustrated schematically in FIGS. 3–4, and indirectly contemplated in FIG. 5. The module comprises a baseplate 44 on which is disposed a ring-like housing member 46 and a cover member 71. These three elements form a substantially closed chamber.

Baseplate 44 is a rectangular plate about 2–4 millimeters thick, 108 millimeters wide and 124 millimeters long. It is preferably of a highly thermally conductive material that has a thermal expansion coefficient approaching that of silicon. One might think that metal would be preferred as a baseplate 44, because of its high thermal conductivity. However, most high thermal conductivity metals also have a relatively high coefficient of expansion. Silicon has a relatively low coefficient of expansion. Large differences in the coefficient of expansion are objectionable.

The known metals having a thermal expansion coefficient close to silicon, such as fernico, Kovar, Invar and the like, also have relatively low thermal conductivity. Accordingly, we prefer to use laminated, or other types, of composite materials for baseplate 44. They are more desirable for this application because they are designed to have good thermal expansion matching to silicon, and relatively high thermal transfer properties. The most attractive of such composites for our application are metal/ceramic composites. Since they include metal, they are generally electrically conductive, which we believe is a strong asset in our subject application. Such a composite baseplate offers significant benefits to the subject invention, even though the silicon chips are disposed on discrete ceramic substrates, as hereinafter described. Hence, metal is not recommended for baseplate 44 even though effective cooling is important, as hereinbefore mentioned. On the other, hand we have found that a metal/ceramic composite can be quite effectively used in our application. It not only can be made to have high thermal conductivity but also relatively low in its rate of expansion. We prefer to use a composite material that has a coefficient of expansion somewhat close to that of silicon. More precisely, however, we want the composite baseplate 44 to closely match the coefficient of expansion of the composite ceramic substrate subassembly on which the silicon chip is directly supported. We want the substrate subassembly to be quite similar to silicon but recognize that it may not be an exact, precise match. If the substrate subassembly coefficient of expansion does not exactly match that of silicon, then we prefer that the thermal expansion coefficient of the baseplate 44 match that of the substrate subassembly, not the silicon. The substrate subassembly will hereinafter be more fully described. As indicated, we prefer that the substrate be electrically conductive and solderable. Many metal/composites are commercially and experimentally available. If not inherently solderable, they should be treated to make them solderable, at least in the areas where the substrate subassemblies are to be mounted.

When a substrate subassembly such as substrate subassembly 10 is soldered to a larger conductive support, the effective area of the substrate's lower copper plate 16 is increased. This enlarges parasitic capacitance. In turn, if the larger conductive support is supported directly on a still larger area aluminum heat sink member, parasitic capacitance increases even more. Using dielectric materials to space these items apart, is usually not desirable because it usually reduces thermal transfer. Hence, increased dielectric thickness is usually not considered desirable.

We have found one metal/ceramic composite that is particularly effective when used as baseplate 44 in this invention. It is sold under the designation MCX-693 by the Lanxide Corporation of Newark Del. It has a coefficient of expansion of about 5–12 ppm per degree centigrade. We prefer 6 ppm per degree centigrade, which is almost exactly the same as that of the Cu/BeO/Cu sandwich we use in substrate subassembly 10. This is close to that of silicon, which is about 3.2 ppm per degree centigrade. The MCX-693 material is essentially a combination of metal and ceramic in which the metal retains its identity sufficiently to provide high thermal conductivity. The ceramic retains its identity sufficiently to lower expansion coefficient but not thermal conductivity. We have found that the MCX-693 composite material additionally has fairly good mechanical strength. Thus it can serve as the baseplate itself, not as a support for it, which eliminates an additional thermal transfer interfaces. It forms a rugged module assembly. Further, it can be coated or plated to make its surface solderable.

Still further, the MCX-693 material has sufficient strength to allow it to be made as a hollow body. This allows the baseplate 44, itself, to also function as a cooling member. In such instance, baseplate 44 need not be mounted on a heatsink, such as heatsink 62, for cooling. It need only be mounted on a mechanical support analogous to what might be used for supporting the heatsink. This not only eliminates costs due to an additional member in the resulting system but eliminates a heat transfer interface. Eliminating a heat transfer interface, and its inherent losses, improves cooling. Improved cooling, in turn, allows the switching transistors to be operated at higher power levels.

Figure 10:
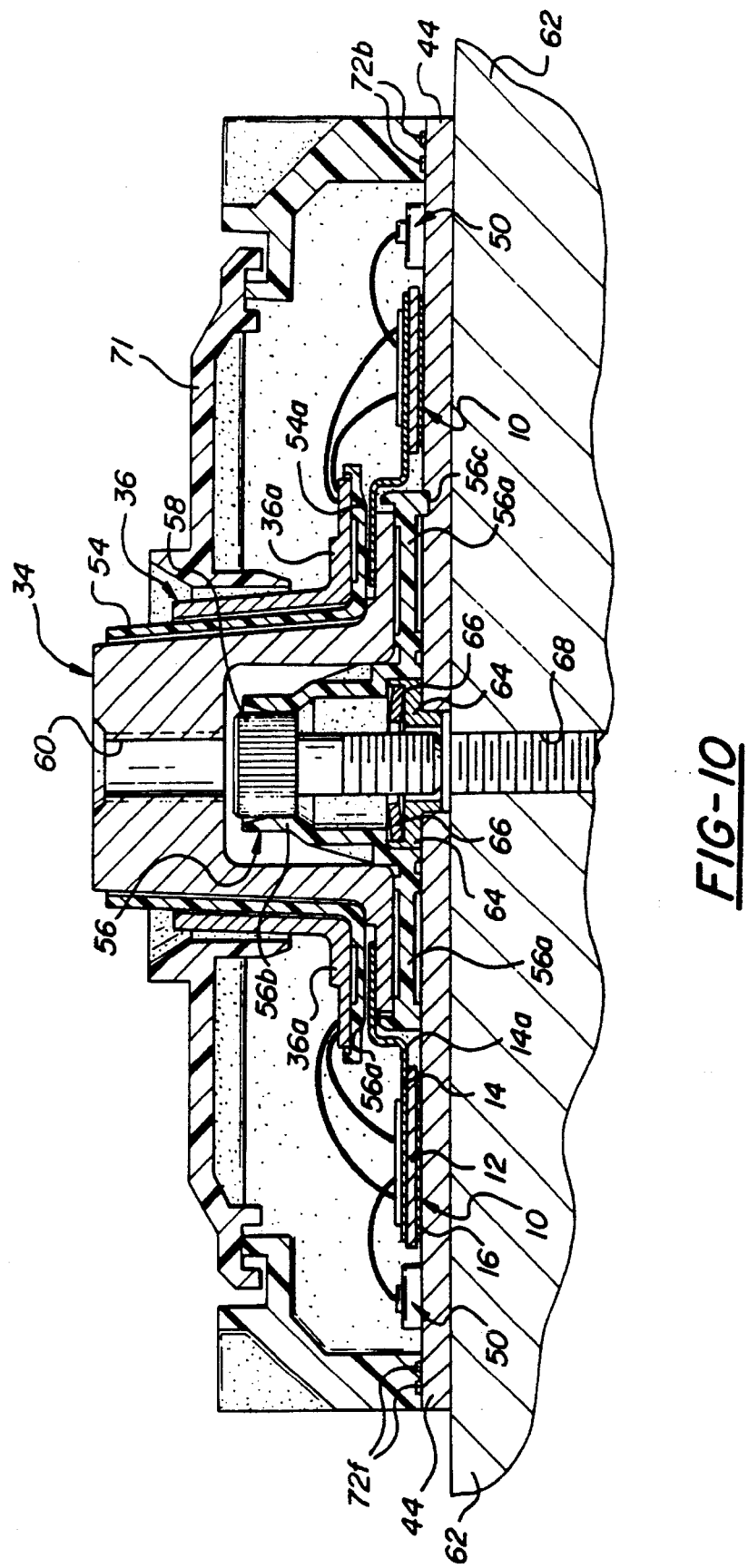
FIG. 10 shows a fragmentary cross-sectional and elevational view along the line 10—10 of FIG. 6.
Figure 11:
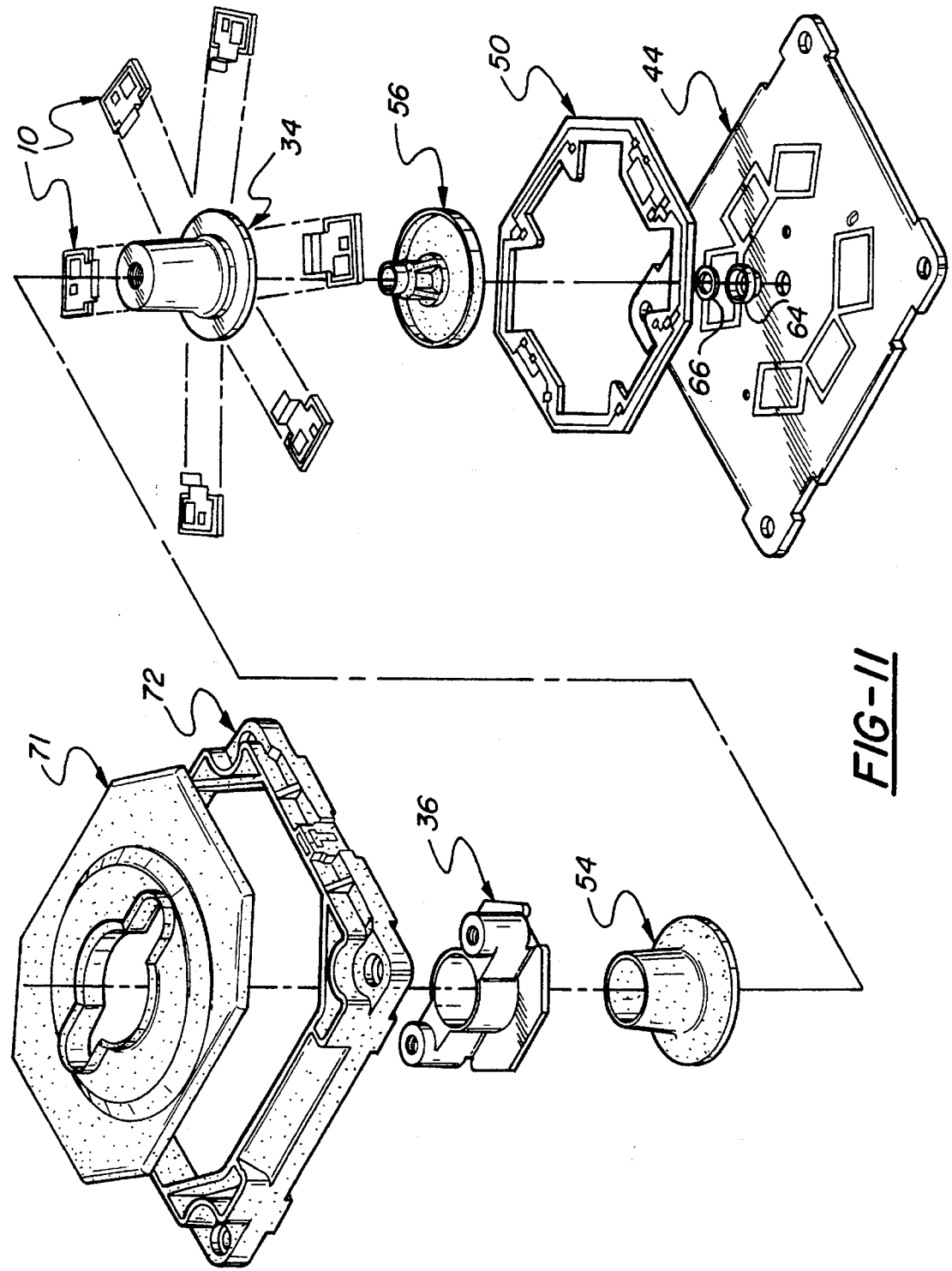
FIG. 11 shows an exploded isometric view of the module shown in FIGS. 3–4 and 6–11.

Disposed on baseplate or backplate 44 is a plurality of the substrate subassemblies 10. They are symmetrically arranged around center coaxial collector terminal 34 and emitter terminal 36 and soldered to baseplate 44. Also disposed on baseplate 44, surrounding substrate subassemblies 10, is a ring-like printed circuit board member 50. Ring-like circuit board element 50 is adhesively bonded to backplate 44 and supports gate conductor 30g, collector Kelvin conductor 34gk, emitter Kelvin conductor 36gk, and trimmable cermet resistor chips 32a–32f. Ultrasonically bonded filamentary wires form the electrical connections between the foregoing conductors and terminals, and the transistors and diodes on the substrate assemblies 10. They are shown in FIGS. 8 and 10.

It should be noted that the ring-like circuit board element 50 can be of the typical FR-1 epoxy/glass circuit board material that supports a copper layer which is defined into a conductor pattern. However, it can also be a porcelainized steel substrate on which a thick film cermet conductor pattern is printed. Disposed on, and adhesively bonded or soldered to, the ring-like circuit board 50 are the six alumina chip resistors 32a–32f hereinbefore referred to. Each trimmable resistor chip is disposed a given predetermined distance away from the transistor gate electrode to which it is to be connected. Thus, every gate lead between every transistor and its associated chip resistor is the same length. Each alumina chip has a cermet thick film resistor block printed on its upper face and a thick film cermet conductor coating enveloping each end, and overlapping onto the printed resistor block. If the enveloping end coating is solderable, it can be soldered directly to conductor 30g on circuit board 50. If not solderable, then the connection to 30g can be made by wire bonding after adhesively bonding the trimmable resistor chip to the circuit board 50. In any event, the trimmable resistor chip is affixed to circuit board 50 with its backside down, leaving the resistor-coated topside surface available for laser trimming. On the other hand, if circuit board 50 is of porcelainized steel, resistor chips would not necessarily be used. Instead the trimmable resistors 32a–32f would be integrally included in circuit board 50 and integrally interconnected with gate conductor 30g. Hence, a soldered or filamentary wire connection with 30g is also eliminated, along with discrete resistor chips. Nonetheless, the remaining discussion will describe the module as having discrete trimmable resistor chips.

One end of each of the trimmable resistors 32a–32f is connected to the gate electrode 26 of its respective associated switching transistor. This is done by means of a filamentary wire (shown in FIGS. 8 and 10) between the gate electrode 26 and wire bond contact pad or electrode on the trimmable resistor chip. Trimmable resistors 32a–32f are also disposed so that they are accessible for trimming or re-trimming at the end of assembly but before the housing cover 71 is put on.

It can be seen that each tab 14a of the respective substrate subassemblies 10 is welded to a circumferential flange on the inner coaxial terminal 34. Accordingly, inner coaxial terminal 34 forms the collector, or output terminal of the module. Tab 14a can be soldered or otherwise bonded in a low electrical resistance connection to the circumferential flange 34a on terminal 34. We prefer to make terminal 34a of copper and tab 14a of copper. Rather than soldering them together, we prefer to weld them together by electron or laser beam welding. A fixture and process for welding the tabs 14 to terminal flange 34a is described and claimed in a U.S.

patent application Ser. No. 08/233,572, entitled "Electron and Laser Beam Welding Method and Apparatus", which was referred to above.

Substrate subassemblies 10 have to be attached to base plate 44 early in the assembly process because they are soldered. After they are tested, the lowermost central parts of the coaxial terminal assembly are affixed to the baseplate by adhesives. Tab 14 is bent up at bend line 17b in order to accommodate collector flange 34a. Because of bend line 17b, tab 14 can readily and safely be bent up after substrate subassembly 10 is soldered to baseplate 44. After terminal 34 is bonded to the board, tab 14 is bent over terminal flange 34a, at bend line 17b. Because of bend line 17b, tab 14 bends readily and safely, and ends up somewhat parallel to the upper surface of flange 34a to which it is bonded. The welding method and apparatus of the above-mentioned U.S. patent application Ser. No. 08,233,572 take advantage of this pre-orientation of tab 14 on flange 34a, to clamp the two together, mask tab edges, and electron or laser beam weld tab interior portions 52 to flange 34a. If electron or laser beam welding could not be done, hand soldering of tab 14 to flange 34a might have been required, which would have significantly increased cost.

Reference is now made to FIGS. 8, 9 and 10. FIG. 8 shows the module in the next stage of manufacture, after the stage of manufacture illustrated in FIG. 7. FIG. 10 shows a cross-sectional view of the completed device. A generally cylindrical dielectric sleeve 54 surrounds terminal 34. Sleeve 54 has a circumferential outward flange 54a that overlies the outward circumferential flange 34a of terminal 34. Dielectric spacer 54 can be of any suitable electrically nonconductive material, such as plastic. Disposed on dielectric spacer 54 is the outer coaxial terminal 36, which also has an outward circumferential flange 36a disposed above the other circumferential flanges 34a and 54a.

Figure 6:
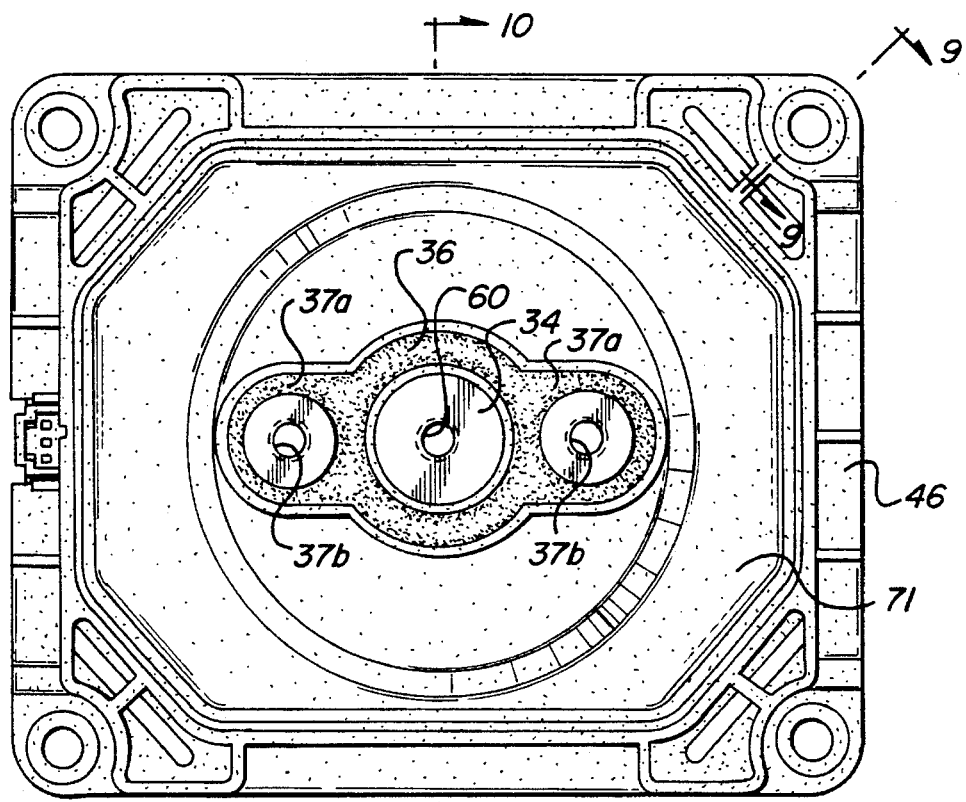
FIG. 6 shows a plan view of a single switch module having coaxial input/output terminals and cover in place.

While terminal 36 is essentially cylindrical, it can be seen in FIGS. 6 and 8 that the central part of terminal 36 has two diametrically opposite enlargements 37. These enlargements are respectively bored and threaded at 37a to facilitate connection of a bus bar to terminal 36. The upper end of terminal 34 is axially bored and threaded, for connection to a collector bus. Having opposed bus connection points 37a on terminal 36 provides increased uniformity in electrical resistance between the emitter bus and the substrate subassemblies 10. It should be noted that a compromise has been made regarding opposed enlargements 37a. They are present to increase current uniformity but their presence interferes with the wire bonding head for the filamentary connector wires. It is intended in this invention that all filamentary wires of corresponding elements, for example 36a–36f, be of the same length.

As can be seen in FIG. 8, the filamentary wires bonding wires closest to the terminal enlargements 37, i.e., wires 36a and 36d, have to be angled slightly differently from the rest. This would make them slightly longer than the rest. However, this can be accommodated by matching their length in the other wires. It should also be noted that the hexagonal periphery of flange 36a provides a straight line edge on flange 36a opposite each substrate subassembly 10. This allows the multiple wires in each group of IGBT emitter wires 36a–36f to be closer to the same length. In addition, it should be recognized that each group of filamentary connecting wires 36a–36f is generally parallel to tab 14a. However, they are parallel in only one plane, they are somewhat spaced apart, and are of a different configuration from tab 14a. Inductance cancellation between them, is therefore not optimum. The straight edges on terminal flange 36a allows the average length of the connecting wires 36a–36f to be shorter. Hence the length of uncancelled inductance is shorter, reducing module losses and increasing performance.

It should be recognized that the filamentary wires 28a connect the emitter side of SFD chip 20 to flange 36a of input terminal 36. Filamentary wires 36a–36f respectively connect emitter areas 24 of transistors 18a–18f to flange 36a of input terminal 36. The filamentary wires and chip metallizations are preferably relatively thick aluminum alloy, effective to reduce series resistance.

Electrode 26 on chips 18a–18f are respectively in low resistance electric communication with laser trimmable chip resistors 32a–32f by means of filamentary wires 26a–26f. One end of each filamentary wire 26a–26f is bonded to the electrode 26. The other end is to the electrode on one end of the laser trimmable chip resistor. The electrode on the other end of each chip resistor is connected by a filamentary wire to a bond tab that is part of gate conductor pattern 30g on the patterned circuit board 50.

An emitter Kelvin connection is made to flange 36a by a filamentary wire 36ak extending from flange 36 to a bond pad on circuit board 50, which bond pad is part of a collector Kelvin conductor 36gk on circuit board 50.

Terminal 36 and in particular the upper surface of flange 36a is nickel-plated, to enhance bonding of aluminum filamentary wires thereto.

Trimmable chip resistors 32a–32f can be soldered directly to gate conductor 30g on board 50, as previously mentioned. If they are not, one end of a filamentary wire will have to be bonded to one end of the chip resistor and to the other to gate conductor 30g. In such instance, a wire bond pad is first soldered to the circuit board. The wire bond pads on board 50 and chips 32a–32f are of a material, or at least have a surface coated with a material, that is metallurgically compatible with the wire bonded thereto. An aluminum surface may be preferred if the filamentary wire is aluminum.

The collector Kelvin connection is made by bonding filamentary wires 34ak–34fk respectively between the metal chip 22 on each substrate subassembly 10 and an adjacent bond pad that is part of Kelvin collector conductor 34gk on circuit board 50. Filamentary wires 34ak–34fk can be of aluminum and ultrasonically bonded. Also as hereinbefore indicated, the bond pad surface on chip 22 should be aluminum, or of some other metal generally compatible with the bonding wire.

Flange 34a on terminal 34 is electrically isolated from backplate 44 by a circular flanged element 56 having a circumferential flange 56a, and a central tubular portion 56b. Flange 56 has boss 56c on its lower surface that cooperates with a corresponding recess in the upper surface of baseplate 44. This locates element 56 on baseplate 44. It also gives an added mechanical lock between them, to prevent twisting of the coaxial terminal assembly when the bus bars are attached to it and bolted in place.

Element 56 is adhesively bonded to the upper surface of backplate 44 and to the lower surface of flange 34a of terminal 34. Flange 56a has recesses 56b in its upper and lower surfaces. The recesses 56b induce a more uniform thickness of adhesive between element 56 and underlying baseplate 44 and overlying flange 34a. Element 56 can be of any suitable dielectric material as for example, a nonconductive plastic. It can be of the same material as the dielectric spacer 54. It should also be mentioned that spacer 54 is adhesively bonded to the upper surface of terminal 34 and its flange 34a and to the lower surface of outer terminal 36 and its flange 36a. An adhesive recess 54b is provided in the upper surface of flange 54a analogous to the recesses 56b provided in the upper and lower surfaces of flange portion 56a of lower spacer 56.

The input and output terminals 34 and 36 and their associated spacers 54 and 56 have been described and shown as separate elements. They do not all have to be separate. It is conceivable that terminal elements 34 and 36 could be insert molded into a metal/plastic terminal subassembly. In such a subassembly, plastic is molded around terminals 34 and 36 but leaving their critical contact surfaces exposed. Thus, only electrical contact parts of them are exposed. Their other parts are embedded in a matrix of electrically nonconductive plastic, that serves the function of spacers 54 and 56. In such instance reliability and cost should be increased because the resultant subassembly only has one surface to be adhesively bonded. That one surface is the bottom of the terminal subassembly, which would be adhesively bonded to baseplate 44.

The entire subassembly thus far described is surrounded by an electrically nonconductive plastic housing member 72, which includes embedded gate terminal 30, embedded Kelvin collector terminal 34k and embedded emitter Kelvin terminal 36k. These terminals are embedded because it is preferred to mold them into the housing member 72. In such instance, each of terminals 30, 34k, and 36k initially are part of a single lead frame during molding. The lead frame has web portions (not shown) that hold the terminals together for molding. The web portions are not covered by the molding compound and are removed after molding, as is usual. Accordingly, the web portions are not shown in the drawing.

Housing member 72 and baseplate 44 are rectangular in their external configuration even though they house concentric terminals and a circular arrangement of components. This provides the largest area of contact between baseplate 44 and the surface of its supporting member, as for example heat sink 62, when many such housing assemblies are disposed on heat sink 62. Housing member 72 is adhesively bonded to the upper surface of baseplate 44. The adhesive is not shown. Recesses 72b, and surrounding land areas, are provided in the lower surface of housing member 72, for adhesive thickness uniformity.

Figure 7:
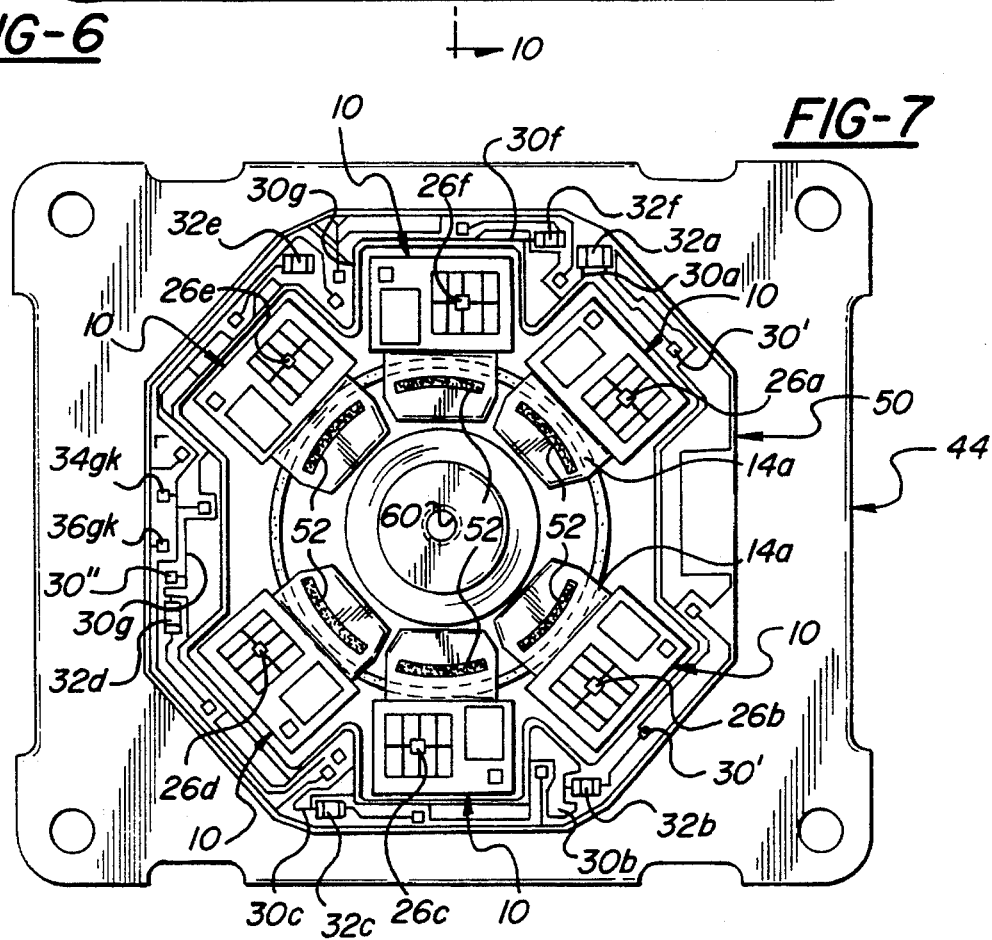
FIG. 7 shows an elevational interior view of the module shown in FIG. 6 in an early stage of assembly before the outer coaxial terminal and housing side walls and top are included, showing a circular array of switching transistors and gate circuiting.

As seen in FIGS. 6–8, housing member 72 is essentially a rectangular ring. Its bottom is closed by the baseplate 44. Its top is closed by a cover 71 having a rectangular periphery that nests in a groove on the top edge of the housing member 72. The groove is filled with a silicone adhesive of the type previously described. One such adhesive is available from Dow Chemical Company of Midland, Mich., and is typical of silicone adhesives used for semiconductor devices and hybrid circuit devices. The adhesive is not shown, to better focus on the important new features of this invention. For the same reason, a filling of silicone oil, grease, or resin is not shown in the drawing. The use of a silicone filling is not new. It is commonly used as a filler, and at least as a coating, in semiconductor device packages. It not only passivates the chips but the resin helps mechanically. Terminals 34 and 36 project up out of the module through a conforming recess in the cover 71, as shown. The silicone filling can be substantially completed before cover 71 is seated in the groove on the top of the housing 72, and then finished after the cover is seated. This may include a bead of resin filling the space between the terminal 36 and the center aperture of the cover 71.

As indicated above, the completed switch assembly, i.e., module, is mounted on the upper surface of heatsink 62, probably with other such modules (not shown). It will likely share the heatsink with other modules, if it is part of the three-phase inverter circuit illustrated in FIG. 5. Baseplate 44 of the module is affixed to the heatsink 62 by means of center bolt 58 and corner bolts 70. As is typical of such installations, a layer of silicone grease is preferably disposed between the baseplate 44 and the heat sink 62, to insure good thermal transfer between the facing surfaces even if they are not perfectly flat.

Center mounting bolt 58 is trapped within a center recess within terminal 34. Bushing 64 is nested in a recess of the baseplate and encircles the threaded lower portion of 58. Bushing 64 has a shoulder on its upper periphery that locates a belleville spring washer 66, which also encircles the threaded lower portion of bolt 58. Heatsink 62 has threaded bores 68 for receiving bolts 58 and 70. The head of bolt 58 is frictionally retained within the upper portion 56b of tubular spacer 56 for shipment. The head of bolt 58 is adapted to cooperate with a tool such as an allen wrench through threaded central bore 60 in terminal 34. Bolt 58 would be pushed down from frictional engagement with the top 56b of spacer 56 into engagement with a threaded bore 68 in heat sink 62. The head of bolt 58 engages the spring washer 66. Spring washer 66 helps maintain a constant pressure between the baseplate 44 and heat sink 62 during thermal cycling, without inducing too much mechanical stress between them. It can be seen that the four corners of the housing are also bolted down. FIG. 9 shows one of the corner bolts 70 and its encircling spring washer 66. As with bolt 58, the corner bolts 70 are disposed in recesses but only the spring washer 66 is trapped.

The foregoing detailed description of FIGS. 2–11 are of a single switch module. In such a module all of the substrates 10 are connected to terminal 34. Hence, the collectors of all transistors 18 are tied together at terminal 34. In addition, the emitters of all transistors 18 are electrically parallelled by their connection to terminal 36. Accordingly, the switch comprised by the module of FIGS. 3–4 and 6–11 would be functionally equivalent to the switch identified by reference numeral 42 between nodes 34 and 36 in the circuit diagram of FIG. 5. However, if possible and if appropriate matching can be arranged, it would be desirable to combine the switch between nodes 34 and 36 of FIG. 5 with the switch between nodes 36 and 37 of FIG. 5. Combining two single switches in one module is referred to herein as a double switch module. In such instance, the two switches would have a common collector/emitter terminal, as for example at node 36 in FIG. 5.

Figure 12:
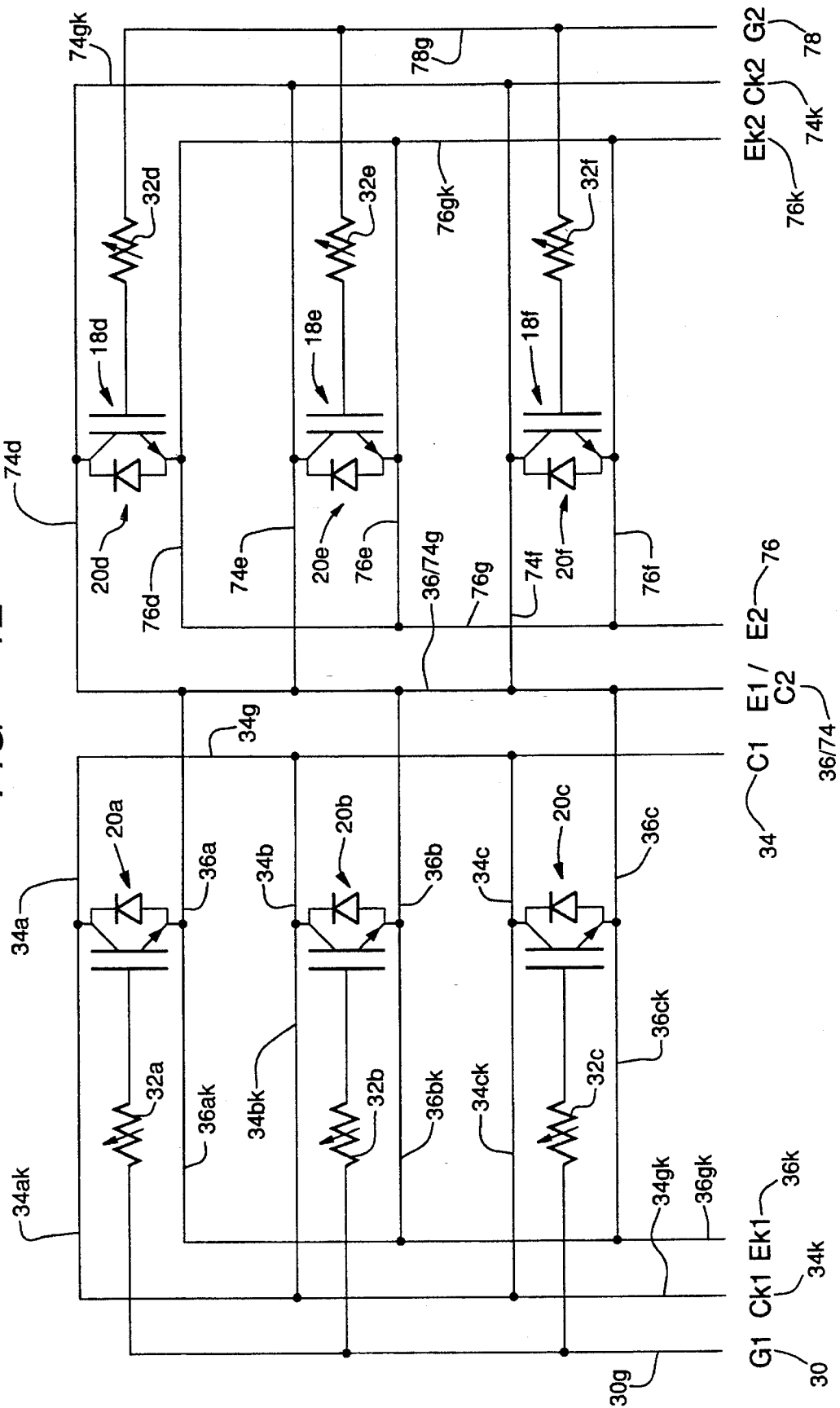
FIG. 12 shows a conceptual electrical schematic of a dual switch module containing two groups of mutually electrically paralleled substrate subassemblies of the type shown in FIGS. 1 and 2.
Figure 13:
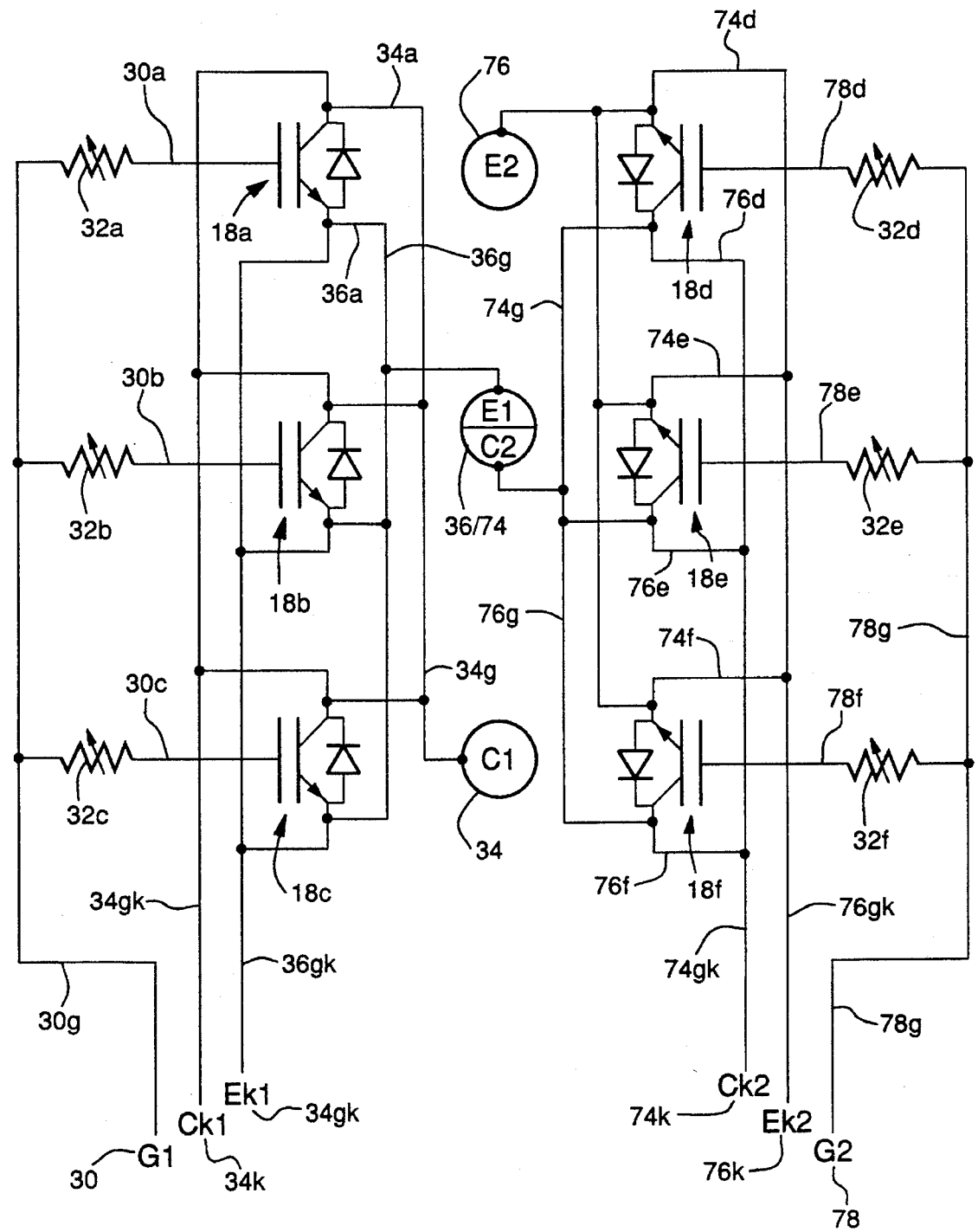
FIG. 13 shows the electrical schematic of FIG. 12, as it is actually embodied in FIGS. 14–20.

A double switch, such as referred to in the preceding paragraph, is schematically illustrated in greater detail in FIGS. 12 and 13. A linear form of such a double, or dual, switch is actually shown in FIGS. 14–20 of this application. However, the double, or dual, switch can also be made into a circular form. A circular form of the double, or dual, switch is described and claimed in the related U.S. patent application Ser. No. 08/278,199, entitled "Triaxial Double Switch Module".

FIG. 12 shows the electrical schematic from a conceptual standpoint for ease of understanding. FIG. 13 shows the same electrical schematic in the actual manner it takes form in the following FIGS. 14–20. FIGS. 12 and 13 each show six transistor/diode pairs. However, in comparing FIG. 12 with FIG. 3, one can see that in FIG. 12 (the double switch), the six pairs of transistors and diodes are divided into two groups of three pairs each. In FIG. 3, all six pairs are grouped together in one switch. In FIG. 12, the six transistor/diode pairs are divided into two groups. The three pairs of each group are electrically in parallel, and form one switch, analogous to all six pairs in FIG. 3. Analogous to the single switch module, the transistors and diodes in each group are initially tested and sorted before mounting on their discrete substrates. After mounting, each transistor/diode pair is tested and sorted as a pair. Similar pairs are then matched and placed in three member groups. Accordingly, the output characteristics of each substrate, i.e., mounted pair, in each group will be substantially the same, to provide the symmetry discussed in connection with the single switch of FIGS. 3–4 and 6–11. In addition, it is highly preferred that all the transistors in both groups be the same, to extend the symmetry even further.

In FIG. 12, the Group I transistors 18a, 18b and 18c all have the same collector terminal 34, emitter terminal 36, gate terminal 30, collector Kelvin 34k and emitter Kelvin 36k. The Group II transistors 18d, 18e and 18f have collector leads 36d, 36e and 36f. It can been seen that the Group II collector leads 74d, 74e, and 74f are connected to the same bus 36g/76g as the Group I emitter leads 36a, 36b and 36c. Accordingly, terminal 36/74 functions as an emitter terminal for the Group I transistors, and as a collector terminal for the Group II transistors.

The emitter leads 76d, 76e and 76f for the Group II transistors have their own bus 76g, which is connected to the Group II transistor emitter terminal 76. Emitter terminal 76 is labeled E2 in FIGS. 12 and 13. Since it is intended that the transistors in Group I will be in the "on" condition when the transistors in Group II are in the "off" condition, and vice versa, a separate gate control electrode is needed for each group. Accordingly, the Group II transistors have their own gate terminal 78, gate bus 78g and gate leads 78d, 78e and 78f.

In order to match the transistors in each group, each of them has a laser trimmable variable resistance 32d, 32e and 32f in series with their respective gate conductors. Analogously, separate emitter and collector Kelvin electrodes 76k and 74k are provided for the Group II electrodes.

Reference is now made to FIG. 13, which schematically shows the actual module layout, including disposition of transistors, as shown in FIGS. 14–20. The principles of chemical, mechanical, and electrical symmetry of this invention were hereinbefore described in connection with a circular structure. Such principles can also be applied to a linear structure, as for example the module of FIGS. 12–20. Moreover, they can be use to form a low inductance module that contains more than one switch. FIGS. 12–20 show a structure with only one pair of switches. On the other hand, it is expected that this invention can be used to form low inductance switching modules with more than one pair of switches.

FIGS. 12–20 are included in this description to illustrate that the important principles of chemical, mechanical and geometrical symmetry simplifies module construction sufficiently to make it commercially manufacturable. This is particularly true when the module is made using our distinctive substrate.

To emphasize both the similarities and the differences between the circular single switch of FIGS. 3–4 and 6–11 and the linear double switch of FIGS. 12–20 similar components are given similar reference numerals. New elements in FIGS. 12–20 are given new reference numerals. For example, in FIGS. 12 and 13 at the left side of the schematic, all of the components have the same reference numerals as shown in FIGS. 3 and 4. However, on the right side of the FIG. 12–13 schematics the reference numerals for the interconnection of the various components had new numerals representing that these are new and additional distinct interconnections. The reason for this is that the three substrate subassemblies on the left form one switch in FIGS. 12–13, while the substrate subassemblies on the right comprise the second switch. In FIGS. 14–17, the three aligned substrate subassemblies 10 at the top of each figure form a first switch, while the three aligned subassemblies 10 at the bottom of each figure comprise the second switch.

In the linear construction shown in FIGS. 14–20, the aforementioned input and output terminal parallelism and overlap are extensively used. For example, input and output conductors 34g and 36g for the first switch take the form of generally registered overlapping parallel plates (shown at the top of each of FIGS. 14–17). Similarly, input and output conductors for the second switch take the form of substantially registered overlapping parallel plates 74g and 76g (shown at the bottom of each of FIGS. 14–20. Because of such symmetry and overlap, input and output inductances in both switches are effectively canceled, or neutralized.

Figure 14:
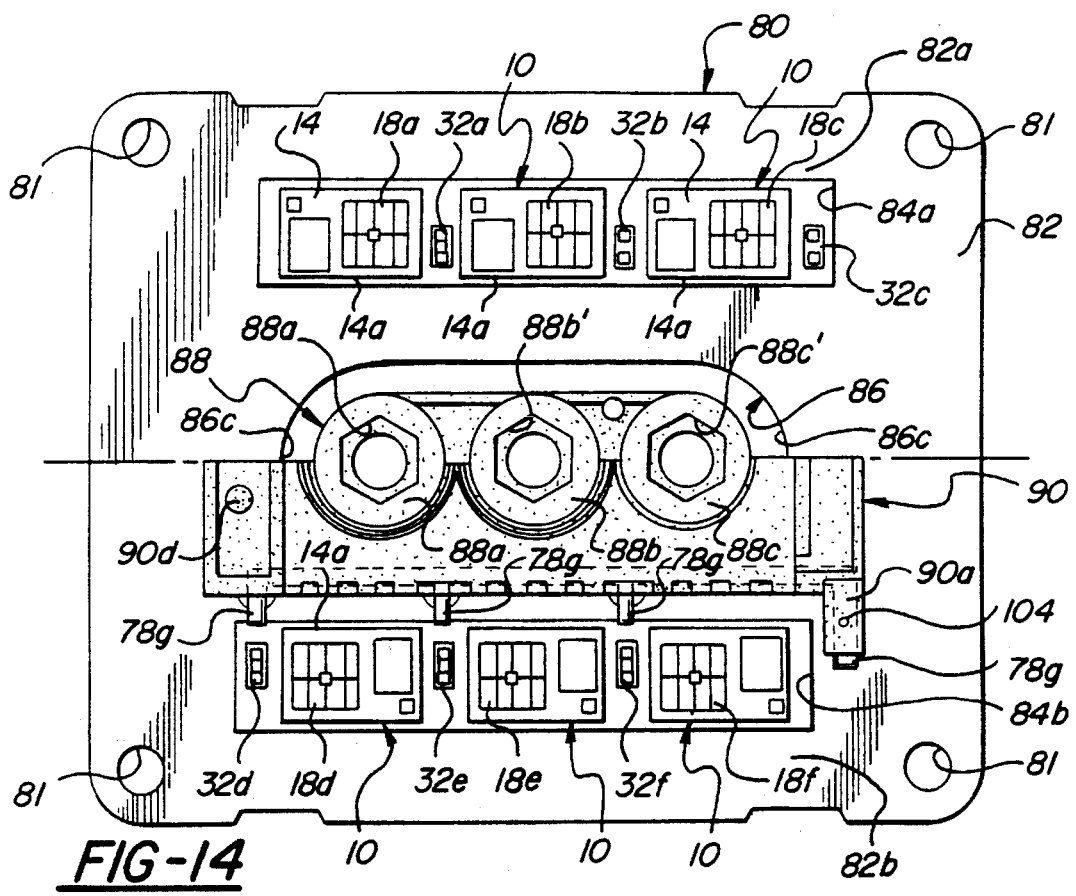
FIG. 14 shows a plan top view (with part broken away) of a linear type dual switch module in an early stage of assembly and showing two linear groups of transistor substrates.

Reference is now made specifically to FIG. 14, which shows a plan view, with the upper part of the figure broken away. FIG. 14 shows a linear type, double switch module in an early stage of assembly. The module has a generally annular baseplate 80, which has a flat annular upper surface 82, that has a generally rectangular outer periphery. Baseplate 80 has apertures 81 in each of its four corners, to receive mounting bolts (not shown). The mounting bolts are used to clamp baseplate 80 to a support (not shown). As can better be seen in FIGS. 18–19, baseplate 80 is hollow, and liquid cooled. Its support thus does not have to be a heat sink, such as heat sink 62 in the earlier embodiment of this invention. More will be said about liquid cooling of the baseplate later, in connection with the description of FIGS. 18 and 19.

The inner periphery of baseplate surface 82 is formed by an elongated central slot 86. Slot 86 has two parallel long sides 86a and 86b, and is symmetrically rounded at its opposed ends 86c, similar to the outer periphery of a horse race track. This results in two parallel elongated portions 82a and 82b of surface 82, spaced symmetrically by the slot. Each of the elongated surface portions 82a and 82b has an elongated rectangular region, respectively designated as 84a and 84b. Elongated rectangular regions 84a and 84b are symmetrically disposed with respect to one another on parallel surface portions 82a and 82b. Hence, the rate of cooling in corresponding parts will be similar. In addition, surface portions 84a and 84b are especially prepared to receive substrate subassemblies 10 and thick film resistor chips 32a–32f. By specially prepared, we mean that regions 84a and 84b are readily solderable, i.e., nickel plated, if substrates 10 and/or chip resistor substrates 32a–32f are to be soldered in place. On the other hand, if they are to be adhesively bonded in place, baseplate surface portions 84a and 84b are especially prepared, i.e., etched and/or microroughened to aid in adhesion.

The substrates 10 and chip resistor substrates 32a–32f are preferably the same as described in the preceding example of the invention. This would include a metallized lower surface that permits soldering to the baseplate surface portions 84a and 84b as shown. Chip resistor substrates 32a–32f would each be of ceramic, having a thick film cermet resistor coating in the middle of its upper surface and a connecting thick film cermet noble metal coating on each end. Substrates 10 would be as described earlier and shown in FIG. 1. Although tabs 14a are illustrated as being bent straight up at the edge of substrate 14, perpendicular to surface 82, the profile of the bend line 17a depicted in FIG. 1 may be preferred.

Three substrates 10 are soldered to surface portion 84a, and three more to surface portion 84b. Each group of three is along a line parallel to the centerline of slot 86, and spaced the same distance from it. The chip resistors 32a–32f are disposed as shown. Preferably they are also disposed symmetrically to obtain uniformity in cooling, and thereby uniformity in temperature during operation. Maintaining such uniformity in temperature is important because resistors can change resistance with temperature. In this module resistor chips 32a–32f are present to provide uniform gate voltage to the transistors on substrates 10. If resistor chips 10 do not change uniformly, gate voltage will vary among the transistors, producing a loss in the intended symmetry that this invention provides. As shown, transistors 18a–18c are disposed on the substrates 10 along the upper part of FIGS. 14–17. Transistors 18d–18f are disposed on the substrates 10 along the lower part of those Figures.

A first plastic spacer 90 is disposed on baseplate surface 82, between the two rows of substrates 10. First plastic spacer 90 is of electrically nonconductive plastic, as is all the rest of the plastic elements to be described in this module of the invention. First plastic spacer 90 is a generally plate-like rectangular member that has many added conformations. One of the conformations is an annular wall-like projection 90e on its lower surface. The wall-like projection 90e nests within slot 86. Projection 90e locates first plastic spacer 90 on surface 82, with respect to the elongated rectangular surface portions 84a and 84b. Nested within the wall-like projection 90e, and adhesively bonded thereto, is a complex plastic molding 88. Complex plastic molding 88 has three cylindrical projections 88a, 88b and 88c, uniformly spaced along the centerline of the length of the slot. Cylindrical projections 88a, 88b and 88c, respectively, have hexagonal recesses 88a', 88b' and 8c', within which clamping nuts 89 are disposed and adhesively bonded. For ease of illustration, the adhesive is not shown. For analogous reasons, it is not shown in any other parts of FIGS. 14–20 either. The same silicone adhesive as described for the earlier embodiment of this invention can be used for the adhesive in this embodiment too.

The lower surface of first plastic spacer 90, outside of annular projection 90e, is flat and rests on the underlying portion of baseplate surface 82. The two are adhesively bonded together.

First plastic spacer 90 contains a first linear lead frame element 30g and a second linear lead frame element 78g. Both linear lead frame elements are shown in phantom lines in FIG. 16. It should be mentioned that FIG. 16 also shows a second plastic spacer overlying the first plastic spacer. It is not intended that the phantom lines should indicate that the lead frame is in the second plastic spacer. It is made of record here that nothing is embedded in the second plastic spacer. Hence, it contains no embedded lead frame.

The first embedded lead frame element 30g in the first plastic spacer 90 serves as a gate bus for the first group of transistors 18a, 18b and 18c. The second linear bus 78g serves as a second gate bus for the transistors 18d, 18e and 18f. The upper part of spacer 90 is broken away in FIG. 14. However, first plastic spacer 90 can be seen in its entirety in FIG. 15, along with the exposed parts of the two embedded lead frames. One can see that there are exposed portions of lead frame 30g opposite the resistor chips 32a, 32b and 32c, as well as in extension 90a. The second lead frame 78g is embedded along the opposite edge of first plastic spacer 90.

Lead frame 78g has free end portions exposed opposite resistor chips 32d, 32e and 32f. It also has a portion embedded within extension 90b, which is diametrically opposed from the first spacer extension 90a.

Spacer 90 has a plurality of additional conformations. These additional conformations serve to locate subsequently assembled components, such as the terminal plates 34g and 74g, and an overlying second plastic spacer 92.

Disposed in the same plane on the first plastic spacer 90 are two metal plates 34g and 74g. They each have a linear edge facing the substrate subassemblies they serve, and a large semicircular enlargement. The enlargement on terminal plate 74g is central to the length of the plate. The enlargement on terminal plate 34g is at one end. The two enlargements nest together, separated by a narrow short wall 90c on spacer 90. Part of the enlargement in terminal plate 34g is obscured in FIG. 15 by a cylindrical terminal boss 34. Terminal plates 34g and 74g, and boss 34 are of nickel-plated copper, as are the other terminal plates 36g and 76g and terminal bosses 36/74 and 76. The terminal bosses 34, 36/74 and 76 each have a central bore to receive a bolt 94. Bolt 94 cooperates with a nut 89 in recess 88a' of plastic molding 88 to clamp terminal 76g against baseplate 80. As hereinbefore indicated, the clamping nut 89 would be adhesively bonded within the recess 88a'.

Figure 15:
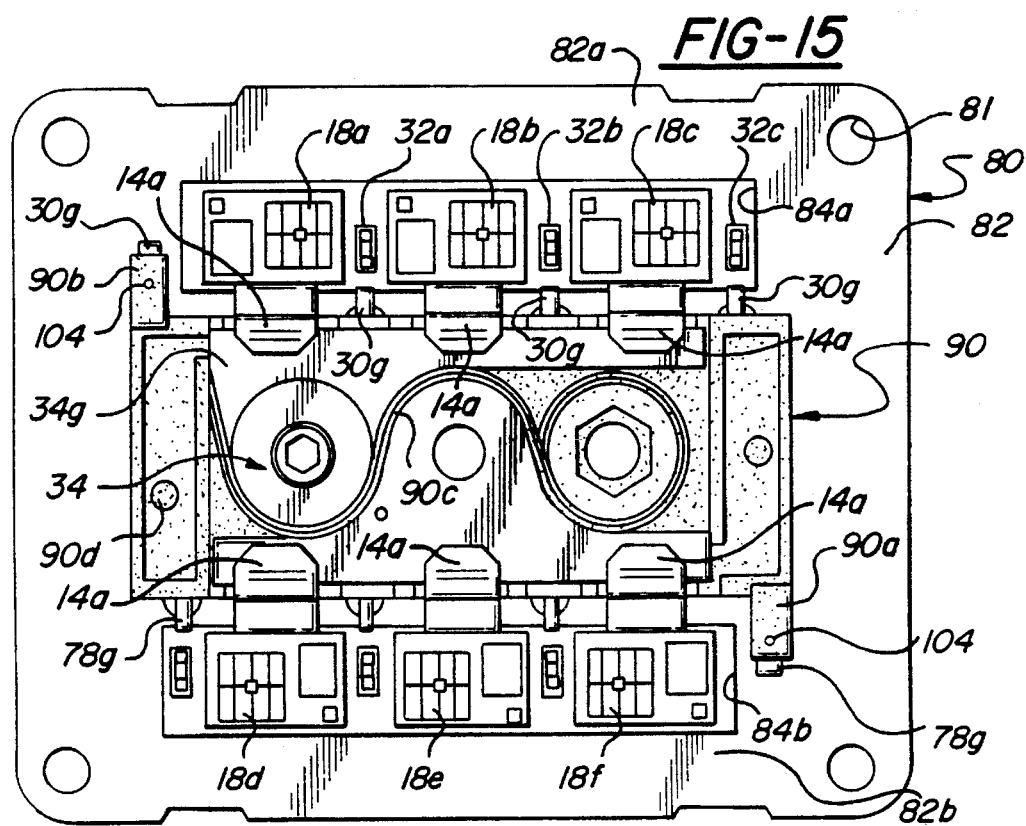
FIG. 15 shows a top plan view of the linear type dual switch module shown in FIG. 14 but in a next following stage of assembly, where the two groups of substrates are connected to their respective terminal plates.

It should also be noticed that in FIG. 15, substrate tabs 14a have now been bent down over their respective terminal plates 34g and 74g. Tabs 14a, therefore have two right angle bends, as does the substrate tab 14a in FIG. 1. Each of the portions at tabs 14a that overlie their respective terminal plates 34g and 74g are electron or laser beam welded to those terminal plates. The weld takes the form of two linear weld strips on each tab. However, if desired, tabs 14a can each be soldered to their respective terminal plates 34g and 74g.

As previously indicated, the conformations on the plastic spacer 90 aid in positioning terminal plate members 34g and 74g with respect to each other and with respect to the tabs 14a. In addition, it should be mentioned that first plastic spacer 90 has an upstanding boss 90d on its left and right edges. These bosses nest in cooperating recesses 92b in the second plastic spacer 92, as can be seen in FIG. 16.

Figure 16:
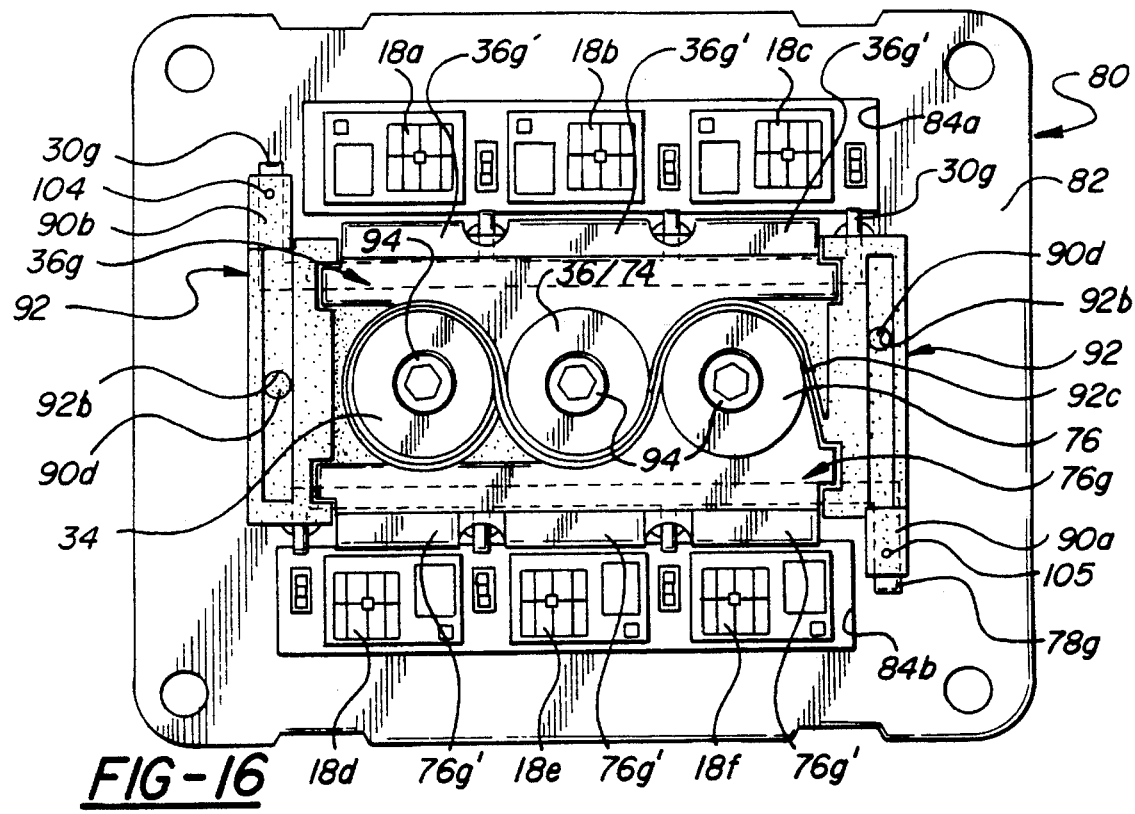
FIG. 16 shows a top plan view of the module of FIG. 15 in a still later stage of assembly, where a second spacer and two more terminal plates have been added.

As can also be seen in FIG. 16, second plastic spacer 92 is a generally plate-like rectangular molded body having alignment conformations. Terminal plates 36g and 76g are disposed on second plastic spacer 92. They are coplanar with each other but aligned over the lower plates 34g and 74g. A short wall 92c helps align terminal plates 36g and 76g over the terminal plates 34g and 76g, so that they are in substantial overlapping relationship. The wall 92c in the second plastic spacer 92 is thus analogous to the wall 90c in the first plastic spacer 90.

It will be noticed from FIG. 16 that the upper pair of terminal planes 36g and 76g are almost mirror images of the lower pair of terminal plates 34g and 74g. However, the upper pair of plates have extensions at their ends that nest in conformations on the upper surface of second plastic spacer 92. In addition it should be noticed that the longitudinal edge of each of the upper terminal plates 36g and 76g, has two notches, that are respectively located over exposed portions of the lead frames 30g and 78g in the first plastic spacer. Hence, the notches in terminal plate 36g are opposite resistor chips 32b and 32c. The notches in terminal plate 76g are opposite resistor chips 32e and 32f.

In addition, spaced by the notches on the linear edge of terminal plate 36g, are three rectangular aluminum laminations 36g'. Aluminum laminations 36g' enhance bondability of filamentary aluminum wires between terminal member 36g and the respective aluminum metallizations forming gate electrodes on transistors 18a, 18b and 18c. For the same reasons, terminal plate 76g has three rectangular aluminum laminations 76g' along its notched linear edge. The aluminum laminations can be formed in any convenient manner and form no part of this invention.

It can be seen that semi-circular enlargement of upper terminal plate 74 overlies the semi-circular enlargement of terminal plate 36. The central bores in these overlapping plate portions are registered. Nickel plated copper washers, of a combined thickness equal to that of the second plastic spacer, are disposed between the overlying semi-circular portions of terminal plates 36g and 74g. FIG. 16 further shows cylindrical terminal boss 36/74 in register with these bores and the combination clamped together by a bolt 94 and a nut 89 (See FIGS. 17–19). It can be understood then that terminal 36/74 forms a common electrical contact, or circuit node, as indicated in the electrical schematics of FIGS. 12 and 13. Terminal boss 46/74, then, forms an emitter terminal for first switch transistors 18a, 18b and 18c and a collector terminal for the second switch transistors 18d, 18e and 18f. The cylindrical terminal boss 76 is analogously clamped to terminal plate 76g, by means of bolt 94, and forms an emitter terminal for the second switch transistors 18d, 18e and 18f. If desired, washers can be used under the terminal plates or under their terminal cylinder bosses to adjust top surface height of the cylinders to match any corresponding connector system that might be employed. In such instance, a common cylinder size could be used for all terminals.

It should be mentioned that it may be preferred to adhesively bond the lower pair of coplanar plates to first plastic spacer, adhesively bond the second plastic spacer to the plates and/or the first plastic spacer, and to adhesively bond the second pair of coplanar plates to the second plastic spacer. Alternatively, and ultimately most preferably, the plates, spacers and washers (if any needed) would all be insert molded into a single metal/plastic composite part. This would be the simplest construction of all, and probably the most economical and reliable.

In any event, once the upper coplanar terminal plates 36g and 74g are in place, wire bonding can proceed. Relatively thick filamentary aluminum wire would be the thermocompression and/or ultrasonically bonded. The wires would extend between the aluminized portions of the terminal plates and the semiconductor devices on the substrates, as shown. They would also extend from the exposed parts of gate bus 30g to resistor chips 32a, 32b and 32c. They would extend from the exposed parts of gate bus 78g to resistor chips 32d, 32e and 32f. From resistor chips 32a–32f, the aluminum wire would respectively extend to the aluminum-coated gate electrode on transistors 18a–18f.

Figure 17:
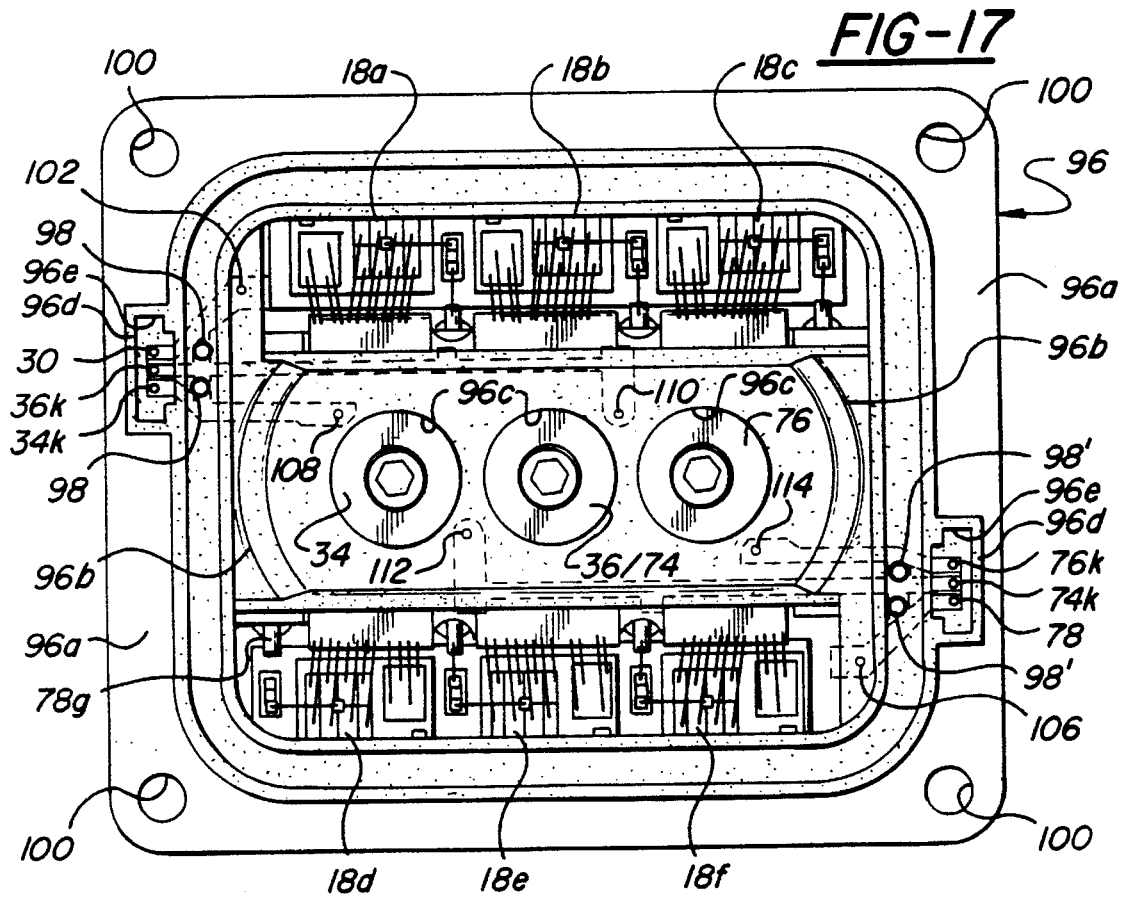
FIG. 17 shows a top plan view of the module of FIG. 16 with housing and wire bonds added.

As hereinbefore indicated, relatively thick filamentary aluminum wire is used. However, as shown in FIG. 17, multiple strands of such wires is used in the transistor and diode large area contacts, in order to handle the high current at low resistance. The multiplicity of wires on the transistors, as previously indicated also tend to improve fatigue life of the bonds for the wires connected to the transistors.

It should be mentioned that geometrical symmetry can be provided even more readily in the linear type of module than in the concentric type of module. It should also be seen that in the linear module the lengths of filamentary wire between the transistors and the terminals extend over tabs 14a. This provides current flow in an opposite but parallel direction.

As previously indicated, this tends to further negate input/output inductance.

Reference is now made to FIG. 17 which shows a housing 96 registered over baseplate 80 and adhesively bonded to baseplate upper surface 82. Housing 96 is of nonconductive plastic and has a ring-like outer portion 96a and a center bridge portion 96b. The center bridge portion 96b has three apertures 96c to accommodate the terminal posts, i.e., bosses, 34, 36/74, and 76. The left side of housing ring 96a has an enlargement 96d that contains a recess 96e within which are disposed terminal tabs 30, 36k and 34k. Analogously, the right side of housing ring 96a has an enlargement 96d'. Enlargement 96d' has a recess 96e' within which are exposed terminal tabs 76k, 74k and 78. The terminal tabs 30, 36k and 34k are exposed ends of a lead frame that is embedded within the housing 96 to form electrical connections with various parts of the assembly at different levels and locations beneath the cover 96. The two embedded lead frames are shown in FIG. 17 in phantom lines. As can be seen, they are similar in configuration but oppositely disposed. Each lead frame can be made a part of the housing by insert molding of the housing. In such instance, after molding, the various interconnecting portions of the lead frame are removed to release the individual parts of the lead frame. The exposed portions can be removed by cutting or stamping, as is usual. In this embodiment of the invention, each of the two lead frames includes two webbed portions under the rim 96a. The webbed portions are removed by drilling holes 98 down through the housing plastic, and down further through the interconnecting webbed portions. This produces a final separation between the various leads 30, 36k and 34k on the left of the figure. Analogously, holes 98' are drilled through the right edge of the housing ring 96a down through the connecting webbed portion between terminal members 76k, 74k and 78. The drilled holes separate the lead frame into three discrete electrically isolated terminals. After the holes 98 and 98' have been drilled, and the respective electrodes separated, the holes can be filled with any suitable material, as for example the same adhesive used to bond the housing 96 to the baseplate 80.

It should also be mentioned that the housing ring portion 96a has holes 100 in its four quarters corresponding to the holes 81 in the four corners of baseplate 80. When cover 96 is bonded to baseplate 80 these holes are left open so that bolts (not shown) can be used to clamp the resultant assembly to a support (not shown).

While not previously mentioned, the first plastic spacer 90 has tiny apertures 104 in its opposed extensions 90a and 90b. These apertures extend down into the thickness of plastic spacer 96 and register with corresponding holes in the embedded lead frame assemblies 30g and 78g. It can also be seen in FIG. 15 that terminal plates 34g and 74g have similar small apertures. FIG. 16 shows small apertures in each of the terminal plates 36g and 76g. Referring now to FIG. 17, aperture 102 in the housing 96 intersects an aperture (not separately shown) in first lead frame element 30 that is embedded in the housing 96. Aperture 102 is the same diameter as, and registers with, the aperture in the first lead frame 30 embedded in housing 96. Aperture 102 is also registered over aperture 104 in lower spacer extension 90b. Tiny aperture 106 in the lower right-hand corner of lead frame 96 intersects an aperture (not separately shown) in second lead frame element 78 that is embedded in the housing 96. Aperture 106 is the same diameter as, and registers with, the aperture in the second lead frame 78 embedded in housing 96. Aperture 106 is also in register with the aperture 105 in the lower spacer extension 90a. Pins (not separately shown) are driven down through each set of registered apertures and through the associated overlapping portions of each pair of embedded lead frames. The pins are rectangular in cross-section and hardened, so that they can be hammered or pressed down. To insure a permanent contact, the diagonal dimension of the cross-section of the pins is about 5–25% bigger than the diameter of the apertures. Much bigger than that may make it difficult to drive the pins down into the second lead frame. The length of the pins is slightly longer than will extend from the surface of housing 96 and through the second lead frame (which is embedded in the first plastic spacer). One pin thus provides electrical contact between exposed contact 30 and the gate bus 30g for transistors 18a, 18b and 18c, via apertures 102 and 104. Analogously, a pin driven through apertures 106 and 105 provides an electrical communication between the gate terminal tab 78 and the lead frame 78g for transistors 18d, 18e and 18f. As mentioned above, the chip resistors 32a–32c and 32d–32f were previously connected by filamentary wires to their respective lead frames 30g and 78g, and also connected by filamentary wires to the gate electrodes of their respective transistors. Accordingly, the chip resistors 32a–32f can be trimmed so that a predetermined gate potential can be applied to transistors 18a–18f. Presumably, the predetermined voltage is the same voltage for all transistors. However, it should be recognized that equal potential is intended to provide equal performance. It is conceivable that in some instances, a different potential may be desired for some or all of the transistors 18a–18f, in order to obtain equal performance. For example a given transistor may need more gate voltage to reach the same operating level as the other transistors.

Kelvin connections have not yet been described for this embodiment of the invention. They are provided from the housing lead frame using a driven-pin type of connection, such as described in the preceding paragraph. They are provided by driving a pin, that is rectangular in cross-section and hardened, into the other apertures in the housing. This connects selected discrete members of the housing leads to selected terminal members. For example, aperture 108 extends through a housing lead frame member and is registered over an aperture in terminal plate 36g. Driving the aforementioned type of pin down through these apertures will interconnect terminal tab 34k with terminal plate 34g. A pin driven down through aperture 110, connects contact tab 36k with terminal plate 36g. A pin driven down through aperture 112, connects contact tab 74k with terminal plate 74g. A pin driven down through aperture 114 connects contact tab 76k with terminal plate 76g. Once the pins have all been driven in, the apertures can be sealed. Adhesive can be used. Then, the chamber formed by housing 96 and baseplate 80 can be filled with a silicone resin or oil, if desired. The filling is not shown because it is optional, and well known. Moreover, showing it would tend to obscure the new and different important features of the invention.

A cover 116, made of nonconductive plastic or the like, is then placed over the housing 96. The outer periphery of cover 116 nests within a circumferential groove in housing 96. An adhesive (not shown) is disposed in the circumferential groove 118 to bond cover 116 to housing 96. Housing 116 has apertures 116a corresponding to and in register with the apertures 96c in the housing bridge portion 96b. Apertures 116a are in register with the apertures 96c in the bridge portion 96b of housing 96, to accommodate the terminal bosses 34, 36/74 and 76.

FIGS. 18 and 19 are respectively width and length centerline cross-sectional views of the completed device. To better emphasize the difference between plastic and metal in these views, plastic is shown with traditional cross-sectioning. Metal is not. In addition, some of the metal elements are shown in elevation. For example, the clamping units 89 are shown in elevation in FIGS. 18 and 19.

Baseplate 80 is the same composite material as used for baseplate 62 in the single switch of FIG. 3–4 and 6–11. However, in this embodiment of the invention, baseplate 80 is hollow. In addition, its interior contains cylindrical postportions 118 extending between upper and lower interior surfaces of the hollow baseplate 80. The interior posts 118 are disposed in a uniform array to enhance heat transfer between substrate 80 and a coolant fluid that passed through the baseplate 80. The cooling fluid enters the interior 122 of baseplate 118 through an entrance duct 120. Interior 122 is at one end of the length of the baseplate and interconnects with two interior portions 124 of the baseplate. Interior portions 124 are disposed on either side of slot 86. The other ends of baseplate interior portions 124 communicate with the interior portion 126 at the other end of the baseplate. Interior portion 126 connects with an outlet port 128.

As previously mentioned, it is important that cooling of all the devices be similar to obtain similarity in electrical operation. Accordingly, the design and arrangement of the columns 118 is the same on both sides of the baseplate aperture 86. Analogously, the flow of cooling fluid from inlet 120 to outlet 128 is designed to be similar on both sides of slot 86. If the cooling is similar, electrical performance of the devices will more likely be similar.

Also, it can be seen in FIG. 17 that each of the exposed electrode tabs 30, 36k, 34k, 74k, 76k and 78 have small apertures in their exposed ends. Pin connectors having a rectangular cross-section can be driven through these apertures to make a permanent connection between them. On the other hand, short pins may be permanently driven into these apertures, with the pins themselves becoming a male connector pin for a push-on female connector.

It is recognized that this invention has been described in connection with certain specific embodiments. On the other hand, it is understood that the basic principles of this invention can take the form of many other embodiments without departing from the spirit of this invention. It is intended that the claims not be limited to the precise embodiments herein disclosed, but only limited as expressly recited in the claims hereof.

We claim:

1. A semiconductor switching device module of reduced inductance comprising:

a housing having a baseplate and defining a chamber;

a first terminal member having a cylindrical body portion and at least one flange, and also having a first inductance;

a second terminal member having a cylindrical body portion that is coaxial and concentric with said first terminal member body portion and that has at least one flange, and also has a second inductance that is substantially similar to said first inductance;

a plurality of insulating substrates, each of which contains only one insulated gate switching transistor chip;

said substrates disposed in said chamber on said baseplate in a generally symmetrical array that encircles said terminals, including their flanges;

a radially outwardly spacing of each of said substrates from a respective flange portion of each of said terminals, said spacing not being further than about a maximum dimension of one of said chips;

a radially inward input electrical connection between each of said chips and a respective flange portion of one of said terminals;

a radially inward output electrical connection between each of said chips and a respective flange portion of the other of said terminals; and a spacing between said first and second terminal members, including their flanges, effective to allow said first and second inductances to negate each other.

2. The module of claim 1 in which each flange is a radially outwardly circumferential flange.

3. The module of claim 2 wherein the flange on at least one of said terminal members has a plurality of segments.

4. The module of claim 2 wherein the cylindrical body portion of the second terminal member surrounds the cylindrical body portion of the first terminal member and said body portion has at least one integral outward radial enlargement adapted for attachment of a bus.

5. The module of claim 4 wherein said cylindrical body portion of said second terminal member has a circumference, the body portion has at least two outward radial enlargements, and said enlargements are substantially symmetrically disposed around the circumference of said body portion of said second terminal member.

6. The module of claim 1 wherein the housing includes, the coaxial terminal members comprise a subassembly affixed to the housing baseplate, at least one of the coaxial terminals includes a threaded bore for attachment of a electrical bus conductor, the baseplate contains a recess, and a surface of said subassembly contacting said baseplate contains a complementary boss nested in said recess, effective to provide a mechanical lock against rotation when said bus conductor is bolted to said subassembly.

7. A high power semiconductor device module such as described in claim 1 in which the plurality of insulated gate switching transistor chips in said chamber are insulated gate bipolar transistors and said transistors collectively comprise a single switch.

8. A high power semiconductor device module capable of operating at high frequency and low parasitic losses comprising:

a housing defining a chamber and including a baseplate and a cover;

a first cylindrical terminal conductor of a given composition and having an axis perpendicular to said baseplate and a first outwardly extending circumferential flange, said first flange disposed within said chamber parallel to said baseplate for connection to a plurality of high power insulated gate switching transistors in said chamber, and an end of said first terminal conductor disposed outside said chamber for connection to a first external bus, said first terminal conductor having a given electrical resistance and inductance with respect to electrical current flow therethrough;

a second cylindrical terminal conductor including a second flange disposed within said chamber for connection to said plurality of high power insulated gate switching transistors and further including an end of said second terminal conductor disposed outside said chamber for connection to a second external bus, effective to permit coaxial nesting of said first and second cylindrical terminal conductors together in spaced relationship in substantial overlapping disposition of cylindrical body portions and also of flange portions;

said insulated gate switching transistors having substantially equal electrical performance characteristics and symmetrically, radially and circumferentially disposed within said chamber in proximity to said first and second flanges for reducing electrical inductance and resistance therebetween;

an input electrical connection between each of said insulated gate switching transistors and said first flange to provide symmetry in input connection resistance and inductance;

an output electrical connection between each of said insulated gate switching transistors and said second flange to provide symmetry in output connection resistance and inductance;

at least a portion of said input and output electrical connections for each insulated gate switching transistor in substantially parallel disposition to each other at least in one plane, and in proximity to reduce net electrical inductance of said input and output electrical connections;

a gate conductor means having a first portion disposed within said chamber and adapted to supply substantially equal gate voltage to each of said insulated gate switching transistors, and further having a terminal portion disposed outside said chamber for connection to a source of gate control voltage, said first portion including a circuit pattern in said housing surrounding the symmetrical disposition of said insulated gate switching transistors, said circuit pattern including a gate conductor pattern for said insulated gate switching transistors; and gate electrical connections between gate electrodes on each of said insulated gate switching transistors and said gate conductor means, whereby said transistors each operate at a predetermined current level.

9. The module of claim 8 wherein the coaxial terminal members comprise a subassembly affixed to the housing baseplate, at least one of the coaxial terminals includes a threaded bore for attachment of an electrical bus conductor, the baseplate contains a recess, and a surface of said subassembly contacting said baseplate contains a complementary boss nested in said recess, effective to provide a mechanical lock against rotation when said bus conductor is bolted to said subassembly.

10. The module of claim 8 wherein the coaxial terminal members are spaced by a dielectric plastic having a cylindrical portion and a flanged portion analogous to that of said coaxial terminal members, and said dielectric plastic and said coaxial terminal members comprise a molded unitary subassembly.

11. The module of claim 10 wherein said first cylindrical terminal conductor is disposed outside said second cylindrical terminal conductor, and the molded unitary assembly includes additional dielectric plastic within said second cylindrical terminal conductor and between said second cylindrical terminal conductor and said chamber.

12. The module of claim 8 wherein said first cylindrical terminal conductor is disposed outside said second cylindrical terminal conductor, and said second cylindrical terminal conductor has a cylindrical body portion that contains integral mounting bolt means.

13. The module of claim 8 wherein said first cylindrical terminal conductor is disposed outside said second cylindrical terminal conductor, and said second cylindrical terminal conductor has a cylindrical body portion that is hollow, the hollow has axially opposite openings, one of the openings is adjacent the housing baseplate and is large enough to accommodate a mounting bolt head, the other opening is not large enough to accommodate said bolt head but is large enough to accommodate a tool for coaction with said bolt head, a module mounting bolt having such a head and a shank, the bolt is recessable in the hollow with its head adjacent said other opening, the baseplate closes the one opening, the baseplate has an opening to said hollow that is big enough to allow the shank of said bolt to pass through but not the bolt head, effective to form an assembly having a trapped mounting bolt recessable within said hollow.

14. The module of claim 8 wherein the module housing has a mounting bolt and the mounting bolt compresses a frusto-conical spring-like washer, effective to maintain a predetermined clamping force between a baseplate of the module housing and a module support.

15. The module of claim 14 wherein the module housing baseplate has a hole in it, the module mounting bolt has a head and a shank, the shank of the mounting bolt is axially movable through the baseplate hole, and the frusto-conical spring-like washer encircles the mounting bolt shank between the mounting bolt head and the baseplate, effective to allow said bolt head not only clamp said baseplate against a support but also to provide integral means for assisting in maintaining the predetermined clamping force during temperature cycling of the module.

16. A high power semiconductor device module such as described in claim 8 in which said plurality of insulated gate bipolar transistors collectively comprise a single switch.

17. A high power semiconductor device module such as described in claim 8 in which a third cylindrical terminal conductor is coaxially nested around said first and second cylindrical terminal conductors, said plurality of transistors collectively comprise two groups of transistors and each group comprises a switch, the first and second coaxial flanged terminal conductors are connected only to one of said groups, said gate conductor means and said gate electrical connection means are connected to said one group of transistors, the second and third cylindrical terminal conductors are connected to the other group of transistors, and an additional gate conductor means and an additional gate electrical connection means are connected to the other group of transistors, effective to provide a separate means for gate potential control to the gate electrodes on the transistors of each group.

18. The module as recited in claim 17 that additionally contains means to provide the same voltage to the gate electrodes of the transistors of both switches.

19. A high power semiconductor device module such as described in claim 8 in which a trimmable resistance unit is included in series with the gate electrode of at least one of said transistors to supply substantilly equal gate voltage to each of said transistors.

20. The module of claim 8 wherein a beam trimmable resistance is electrically in series with the gate electrodes of all of said transistors for closely matching voltage applied to each transistor gate electrode from said terminal portion of said gate conductor means.

21. A high power module such as described in claim 8 in which a trimmable resistance unit is included in series with the gate electrode of each of said transistors for setting voltage applied to each transistor to a predetermined level when a gate control voltage of a given level is applied to the terminal portion of the gate conductor means.

22. A high power module such as described in claim 8 wherein all of said input electrical connections, and all of said output electrical connections have a similar inductance and resistance.

23. The module of claim 8 wherein said chamber contains a plurality of discrete similar insulating substrates, each of said substrates has a single insulated gate switching transistor chip mounted on it, and each of said substrates is supported on said baseplate in intimate similar thermal contact therewith.

24. The module of claim 8 wherein the module also includes a plurality of circumferentially symmetrically arrayed dielectric substrate members, all of said insulated gate switching transistors are disposed on said substrates and each of the substrate members supports only one of the insulated gate switching transistors.

25. The module of claim 8 wherein the insulated gate switching transistors are insulated gate bipolar transistors, the transistors are matched in performance, each transistor is disposed on a separate chip, each chip is disposed on a separate substrate, the substrates are symmetrically arrayed around the circumferential terminal flanges, and said substrates are symmetrically spaced from the terminal flanges not further than about a maximum planar dimension of one of said chips.

26. The module of claim 25 wherein the substrates are predominantly of a wafer of dielectric material and the wafer is metallized on its opposite faces.

27. A semiconductor switching device module of reduced inductance comprising:

a housing defining a chamber;

a first terminal member having a cylindrical body portion and at least one flange, and also having a first inductance;

a second terminal member that has a cylindrical body portion that is coaxial and concentric with said first terminal member body portion and that further has at least one flange, and also has a second inductance that is substantially similar to said first inductance;

a spacing between said first and second terminal members, including their flanges, effective to allow said first and second inductances to negate one another;

a plurality of insulating substrates, each of which contains only one insulated gate switching transistor chip;

said substrates disposed in said chamber in a generally symmetrical array that encircles said terminals, including their flanges;

a radially outwardly spacing of each of said substrates from a respective flange portion of each of said terminals, said spacing not being further than about a maximum dimension of one of said switching transistor chips; and a circuit pattern surrounding the symmetrical array of insulated gate switching transistor chips, said circuit pattern including a gate conductor pattern for said switching transistor chips, an input kelvin conductor pattern and an output kelvin conductor pattern.

28. The module of claim 27 wherein the circuit pattern is on a circuit board and the circuit board includes at least one trimmable resistor in series with a connector to a gate electrode on one of the insulated gate switching transistor chips, for matching gate voltage applied to said devices.

29. The module of claim 28 wherein the circuit pattern is a thick film pattern on a porcelainized circuit board and includes a trimmable thick film printed resistor in series with a connector to each of the insulated gate switching transistor chips, effective to provide means for setting gate voltage to each of said transistor chips to a predetermined value when a given voltage is applied to the gate conductor of said circuit pattern.

30. A high power semiconductor device module such as described in claim 27 in which said the plurality of insulated gate switching transistor chips in said chamber are insulated gate bipolar transistors and said transistors collectively comprise two switches.

31. A semiconductor switching device module of reduced inductance comprising:
   a housing having a baseplate and defining a chamber;
   a first terminal member having a cylindrical body portion and at least one radially outwardly circumferential flange, and also having a first inductance;
   a second terminal member having a cylindrical body portion that is coaxial and concentric with said first terminal member body portion and that has at least one radially outwardly circumferential flange, and also has a second inductance that is substantially similar to said first inductance;
   a plurality of insulating substrates, each of which contains only one insulated gate switching transistor chip;
   said substrates disposed in said chamber on said baseplate in a generally symmetrical array that encircles said terminals, including their circumferential flanges;
   a spacing between said first and second terminal members, including their circumferential flanges, effective to allow said first and second inductances to negate each other; and
   said terminal members spaced by a dielectric plastic having a cylindrical portion and a flanged portion analogous to that of said coaxial terminal members, said plastic and said terminal members comprising a molded unitary subassembly.

32. A semiconductor switching device module of reduced inductance comprising:
   a housing having a baseplate and defining a chamber;
   a first terminal member having a cylindrical body portion and at least one radially outwardly circumferential flange, and also having a first inductance;
   a second terminal member having a cylindrical body portion that is coaxial and concentric with said first terminal member body portion and that has at least one radially outwardly circumferential flange, and also has a second inductance that is substantially similar to said first inductance;
   a plurality of insulating substrates, each of which contains only one insulated gate switching transistor chip;
   said substrates disposed in said chamber on said baseplate in a generally symmetrical array that encircles said terminals, including their circumferential flanges;
   a spacing between said first and second terminal members, including their circumferential flanges, effective to allow said first and second inductances to substantially negate each other; and
   the body portion of one of the coaxial terminals is not only disposed within the body portion of the other terminal, but also contains integral mounting bolt means.

33. The module of claim 32 wherein the integral mounting bolt means includes a hollow in the body portion of the one terminal member, the hollow has axially opposite openings, one of the openings is adjacent the baseplate and is large enough to accommodate a mounting bolt head, the other opening is not large enough to accommodate said bolt head but is large enough to accommodate a tool for coaction with said bolt head, a module mounting bolt having such a bolt head and a shanks, the bolt is recessable in the hollow with its head adjacent the other opening, the baseplate closes the one opening, the baseplate has an opening to said hollow that is big enough to allow the shank of said bolt to pass through but not its head, effective to form an assembly having a trapped mounting bolt recessable within said hollow.

34. The module of claim 32 wherein the integral mounting bolt means includes a mounting bolt and the mounting bolt compresses a frusto-conical spring-like washer, effective to maintain a predetermined clamping force between a baseplate of the module housing and a module support.

35. The module of claim 32 wherein the module baseplate has a hole in it and the module mounting bolt means includes a mounting bolt having a head and a shank, the shank of the mounting bolt is axially movable through the baseplate hole, and a frusto-conical spring-like washer encircles the mounting bolt shank between the mounting bolt head and the baseplate, effective to allow said bolt head not only clamp said baseplate against a support but also to provide integral means for assisting in maintaining a predetermined clamping force during temperature cycling of the module.

36. A high power semiconductor device module capable of operating at high frequency and low parasitic losses comprising:
   a housing defining a chamber and including a baseplate and a cover;
   a first cylindrical terminal conductor of a given composition and having an axis perpendicular to said baseplate and a first outwardly extending circumferential flange, said first flange disposed within said chamber parallel to said baseplate for connection to a plurality of high power insulated gate switching transistors in said chamber, and an end of said first terminal conductor disposed outside said chamber for connection to a first external bus, said first terminal conductor having a given electrical resistance and inductance with respect to electrical current flow therethrough;
   a second cylindrical terminal conductor including a second flange disposed within said chamber for connection to said plurality of high power insulated gate switching transistors and further including an end of said second terminal conductor disposed outside said chamber for connection to a second external bus, effective to permit coaxial nesting of said first and second cylindrical terminal conductors together in spaced relationship in substantial overlapping disposition of cylindrical body portions and also of flange portions;
   said insulated gate switching transistors having substantially equal electrical performance characteristics and symmetrically, radially and circumferentially disposed within said chamber in proximity to said first and second flanges for reducing electrical inductance and resistance therebetween;
   an input electrical connection between each of said insulated gate switching transistors and said first flange to provide symmetry in input connection resistance and inductance;
   an output electrical connection between each of said insulated gate switching transistors and said second flange to provide symmetry in output connection resistance and inductance;
   at least a portion of said input and output electrical connections for each insulated gate switching transistor in substantially parallel disposition to each other at least in one plane, and in proximity to reduce net electrical inductance of said input and output electrical connections;
   a gate conductor means having a first portion disposed within said chamber and adapted to supply substantially equal gate voltage to each of said insulated gate switching transistors, and further having a terminal portion disposed outside said chamber for connection to a source of gate control, said first portion including a circuit pattern in said housing surrounding the symmetrical disposition of said insulated gate switching transistors, said circuit pattern including a gate conductor pattern for said insulated gate switching transistors, an input kelvin conductor pattern and an output kelvin conductor pattern; and gate electrical connections between gate electrodes on each of said insulated gate switching transistors and said gate conductor mans, whereby said transistors each operate at a predetermined current level.

37. The module of claim 36 wherein the insulated gate switching transistors are insulated gate bipolar transistors, the circuit pattern is on a circuit board and the circuit board includes at least one trimmable resistor in series with a connector to the gate electrode on one of the insulated gate bipolar transistors, for equalizing voltage applied to the gate electrodes of said transistors from said terminal portion of said gate conductor means.

38. The module of claim 36 wherein the circuit pattern is a thick film pattern on a porcelainized steel circuit board and includes a trimmable thick film printed resistor in series with a connector to the gate electrode on each of the insulated gate switching transistors, effective to provide means for setting voltage applied to the gate electrode of each of said transistors to a predetermined value when a given voltage is applied to the gate conductor of said circuit pattern from said terminal portion of said gate conductor means.

39. A semiconductor switching device module of reduced inductance comprising:

a housing defining a chamber;

a first terminal member having a cylindrical body portion and at least one flange, and also having a first inductance;

a second terminal member that has a cylindrical body portion that is coaxial and concentric with said first terminal member body portion and that further has at least one flange, and also has a second inductance that is similar to said first inductance;

a spacing between said first and second terminal members, including their flanges, effective to allow said first and second inductances to negate one another;

a plurality of insulating substrates, each of which contains only one insulated gate switching transistor chip;

said substrates disposed in said chamber in a generally symmetrical array that encircles said terminals, including their flanges;

a radially outwardly spacing of each of said substrates from a respective flange portion of each of said terminals, said spacing not being further than about a maximum dimension of one of said switching transistor chips; and a circuit pattern surrounding the symmetrical array of insulated gate switching transistor chips, said circuit pattern including a gate conductor pattern for said switching transistor chips.

* * * * *